United States Patent
Ho et al.

(10) Patent No.: US 12,419,088 B2
(45) Date of Patent: Sep. 16, 2025

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chia-Cheng Ho, Hsinchu (TW); Chia-Yu Wei, Hsinchu (TW); Chan-Yu Hung, Tainan (TW); Fei-Yun Chen, Hsinchu (TW); Yu-Chang Jong, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 389 days.

(21) Appl. No.: 17/813,646

(22) Filed: Jul. 20, 2022

(65) Prior Publication Data
US 2024/0030292 A1    Jan. 25, 2024

(51) Int. Cl.
*H10D 62/17*    (2025.01)
*H01L 21/74*    (2006.01)

(52) U.S. Cl.
CPC ......... *H10D 62/378* (2025.01); *H01L 21/743* (2013.01)

(58) Field of Classification Search
CPC .. H10D 12/441; H10D 12/461; H10D 12/421; H10D 12/491; H10D 12/481; H10D 12/032; H10D 12/035; H10D 12/038; H01L 29/7395; H01L 29/7396; H01L 29/7397; H01L 29/7398; H01L 29/66333; H01L 29/6634; H01L 29/66348
See application file for complete search history.

(56) References Cited

U.S. PATENT DOCUMENTS

| 9,343,526 | B2 | 5/2016 | Cheng et al. |
| 2002/0004282 | A1* | 1/2002 | Hong ............... H01L 21/76224 |
| | | | 257/E21.546 |
| 2014/0203410 | A1* | 7/2014 | Zhang .................... H01L 21/78 |
| | | | 257/620 |
| 2019/0259829 | A1* | 8/2019 | Mun .................... H10D 64/258 |

* cited by examiner

*Primary Examiner* — Christine S. Kim
*Assistant Examiner* — Cole Leon Lindsey
(74) *Attorney, Agent, or Firm* — WPAT LAW; Anthony King

(57) ABSTRACT

A semiconductor structure is provided. The semiconductor structure includes a substrate, a deep trench isolation (DTI), an interconnect structure, and a conductive pillar. The DTI is disposed in the substrate and the interconnect structure is disposed over the substrate. The conductive pillar extends from the interconnect structure toward the substrate and penetrates the DTI. A method of manufacturing the semiconductor structure is also provided.

20 Claims, 23 Drawing Sheets

SEMICONDUCTOR STRUCTURE AND METHOD OF MANUFACTURING THE SAME

BACKGROUND

When integrated circuits are formed on semiconductor substrates for use in high voltage applications, the substrate and components of the integrated circuit must be designed to tolerate high currents and high voltages that are present in power applications. A deep trench isolation is commonly used for a purpose of high voltage operation capability. However, an issue of wafer warpage is observed during manufacturing of a high-voltage-tolerant device. Misalignment of lithography processes in the manufacturing of the high-voltage-tolerant device often results, and product performance is affected.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
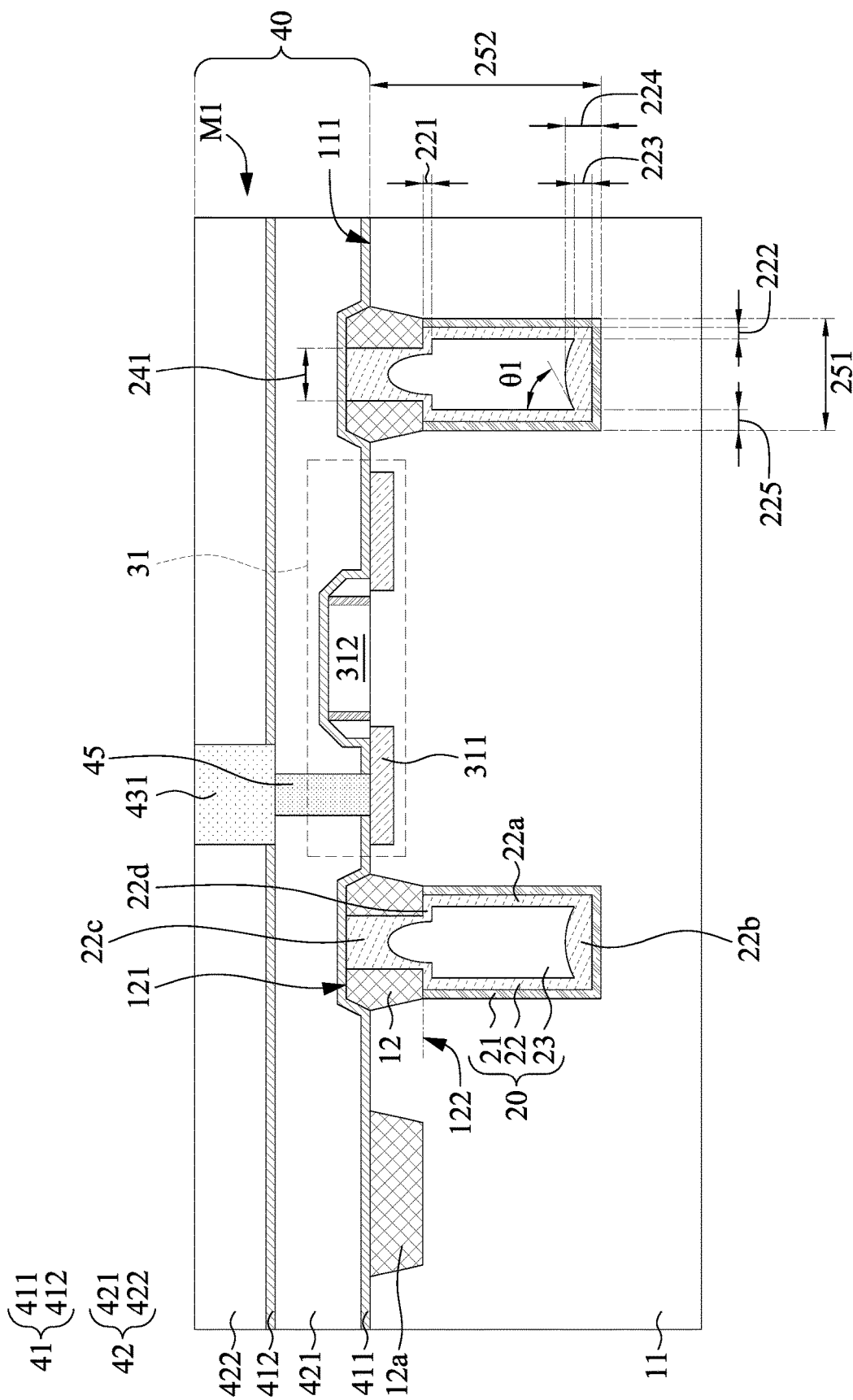
FIG. 1 is a schematic cross-sectional diagram of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional diagram of a semiconductor structure 100 in accordance with some embodiments of the present disclosure. The semiconductor structure 100 can include a substrate 11, a transistor 31, a shallow trench isolation (STI) 12, and a deep trench isolation (DTI) 20. The STI 12 is disposed in the substrate 11 around the transistor 31. The STI 12 referred to herein can represent multiple shallow trench isolations. In some embodiments, the STI 12 includes multiple isolations and surrounds the transistor 31. The DTI 20 is disposed in the substrate 11 under the STI 12. The DTI may include one or more dielectric layers (e.g., 21 and 22) and a gap 23 sealed by the one or more dielectric layers. In some embodiments, the DTI includes a dielectric layer 21 and a dielectric layer 22. The dielectric layers 21 and 22 can be formed in sequence by different operations but an interface between the dielectric layers 21 and 22 may not be observed by an electron microscope.

The substrate 11 may be a semiconductor substrate, a wafer or a bulk substrate. In some embodiments, the substrate 11 includes a bulk semiconductor material, such as silicon. In some embodiments, the substrate 11 includes other semiconductor materials, such as silicon germanium, silicon carbide, gallium arsenide, or the like. The substrate 11 may be of a first conductivity type, e.g., a P-type semiconductive substrate (acceptor type), or a second conductivity type, e.g., an N-type semiconductive substrate (donor type). Alternatively, the substrate 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the substrate 11 includes a semiconductor-on-insulator (SOI). In some embodiments, the substrate 11 includes a doped epitaxial layer, a gradient semiconductor layer, a semiconductor layer overlaying another semiconductor layer of a different type, such as a silicon layer on a silicon germanium layer, or a combination thereof.

The transistor 31 may represent one or more electrical components. The electrical components can be active components or devices, and may include different types or generations of devices. The electrical components can include a planar transistor, a multi-gate transistor, a gate-all-around field-effect transistor (GAAFET), a fin field-effect transistor (FinFET), a vertical transistor, a nanosheet transistor, a nanowire transistor, or a combination thereof. For a purpose of simplicity, a planar transistor is depicted as the transistor 31 in the figures as an exemplary embodiment of an electrical component, but such depiction is not intended to limit the present disclosure. In some embodiments, the transistor 31 includes source/drain (S/D) regions 311 disposed in the substrate 11 and a gate structure 312 disposed at a surface 111 of the substrate 11 between the source/drain regions 311.

The DTI 20 may extend from a bottom of the STI 12 surrounding the transistor 31. In some embodiments, the transistor 31 defines a high voltage device, and the STI 12 and the DTI 20 surround the transistor 31 for reduction of parasitic effect and high voltage operation capability. In some embodiments, a depth 123 of the STI 12 from the surface 111 of the substrate 11 is in a range of 0.1 to 0.5 microns (μm). In some embodiments, the STI 12 protrudes from the surface 111 of the substrate 11. In some embodiments, the STI 12 is substantially coplanar with the surface 111 of the substrate 11, similar to a configuration of an STI labeled 12a in FIG. 1. A configuration of the STI 12 is not limited herein. In some embodiments, the DTI 20 extends from a bottom 122 of the STI 12. In some embodiments, a depth 252 of the DTI 20 from the surface 111 of the substrate 11 is in a range of 0.3 to 50 μm. In some embodiments, a width 251 of the DTI 20 is less than the depth 252 and in a range of 0.1 to 20 μm.

The DTI 20 may include the dielectric layers 21 and 22 and a gap 23 sealed by the dielectric layer 22. In some embodiments, the dielectric layer 21 is disposed below the STI 12 and lines the substrate 11. In some embodiments, the dielectric layer 22 lines the dielectric layer 21 and penetrates the STI 12. In some embodiments, a cap portion 22c of the dielectric layer 22 is disposed within the STI 12. In some embodiments, a width 241 of the cap portion 22c of the dielectric layer 22 is in a range of 0.5 to 10 μm. An overall thickness of the dielectric layer 22 below the STI 12 is greater than an overall thickness of the dielectric layer 21. In some embodiments, the thickness of the dielectric layer 21 is in a range of 0.001 to 1 μm. In some embodiments, a thickness 221 of a top portion 22d of the dielectric layer 22 at the bottom 122 of the STI 12 is less than a thickness 222 of a vertical portion 22a of the dielectric layer 22. In some embodiments, the thickness 221 of the dielectric layer 22 is in a range 0.01 to 0.1 microns (μm). In some embodiments, the thickness 222 of the dielectric layer 22 is in a range of 1 to 10 μm. In some embodiments, a total thickness 225 of the vertical portion 22a and the dielectric layer 21 at the vertical portion 22a is in a range of 0.1 to 1 μm. In some embodiments, a thickness 223 of a bottom portion 22b of the dielectric layer 22 at a bottom of the DTI 20 is greater than the thickness 222. In some embodiments, a total thickness 224 of the bottom portion 22b and the dielectric layer 21 at the bottom of the DTI 20 is in a range of 0.15 to 1.5 μm. The thickness 223 of the bottom portion 22b the dielectric layer 22 can vary along an extending direction of the bottom of the DTI 20 due to a property of deposition. In some embodiments, the thickness 223 is in a range of 1 to 20 μm. In some embodiments, an angle θ1 between the vertical portion 22a and the bottom portion 22b of the dielectric layer 22 is in a range of 10 to 90 degrees.

The gap 23 is defined at least below the STI 12 by the dielectric layer 22, and the dielectric layer 22 seals the gap 23 in the STI 12. In some embodiments, the gap 23 extends upward into the STI 12. The dielectric layer 22 may include a concave surface toward a top 121 of the STI 12 due to auto-sealing characteristics of the deposition of the dielectric layer 22. Thus, the gap 23 may include a convex top surface and a concave bottom surface toward the top 121 of the STI 12 or the surface 111 of the substrate 11.

The semiconductor structure 100 may further include an interconnect structure 40 disposed on the surface 111 of the substrate 11. The interconnect structure 40 may include multiple etch stop layers 41 and multiple inter-layer dielectric (ILD) layers 42 alternatingly arranged and disposed over the substrate 11 in sequence. For instance, an etch stop layer 411 represents a first etch stop layer over the substrate 11. In some embodiments, the etch stop layer 411 is conformal to the surface 111 of the substrate 11, the STI 12, and the transistor 31. An ILD layer 421 represents a first ILD layer of the multiple ILD layers 42 on the etch stop layer 411 over the substrate 11. The interconnect structure 40 may also include one or more contact vias 45 disposed in the ILD layer 421 and penetrating the etch stop layer 411 to electrically connect to the S/D regions 311 and/or the gate structure 312 of the transistor 31. The contact via 45 is depicted in the figures for a purpose of illustration. The contact via 45 electrically connects to a metal line 431 disposed in an ILD layer 422 and penetrating an etch stop layer 412, wherein the etch stop layer 412 represents the second etch stop layer over the substrate 11 and the ILD layer 422 represents the second ILD layer over the substrate 11. In some embodiments, the metal line 431 is one of multiple metal lines disposed in a first metal line layer M1 of the interconnect structure 40. The interconnection structure 40 may include multiple metal line layers M1, M2, . . . , and Mn, wherein n is a positive integer greater than 2. The figures may include only one or two metal line layers of the interconnect structure 40 for exemplary illustration.

Figure 2:
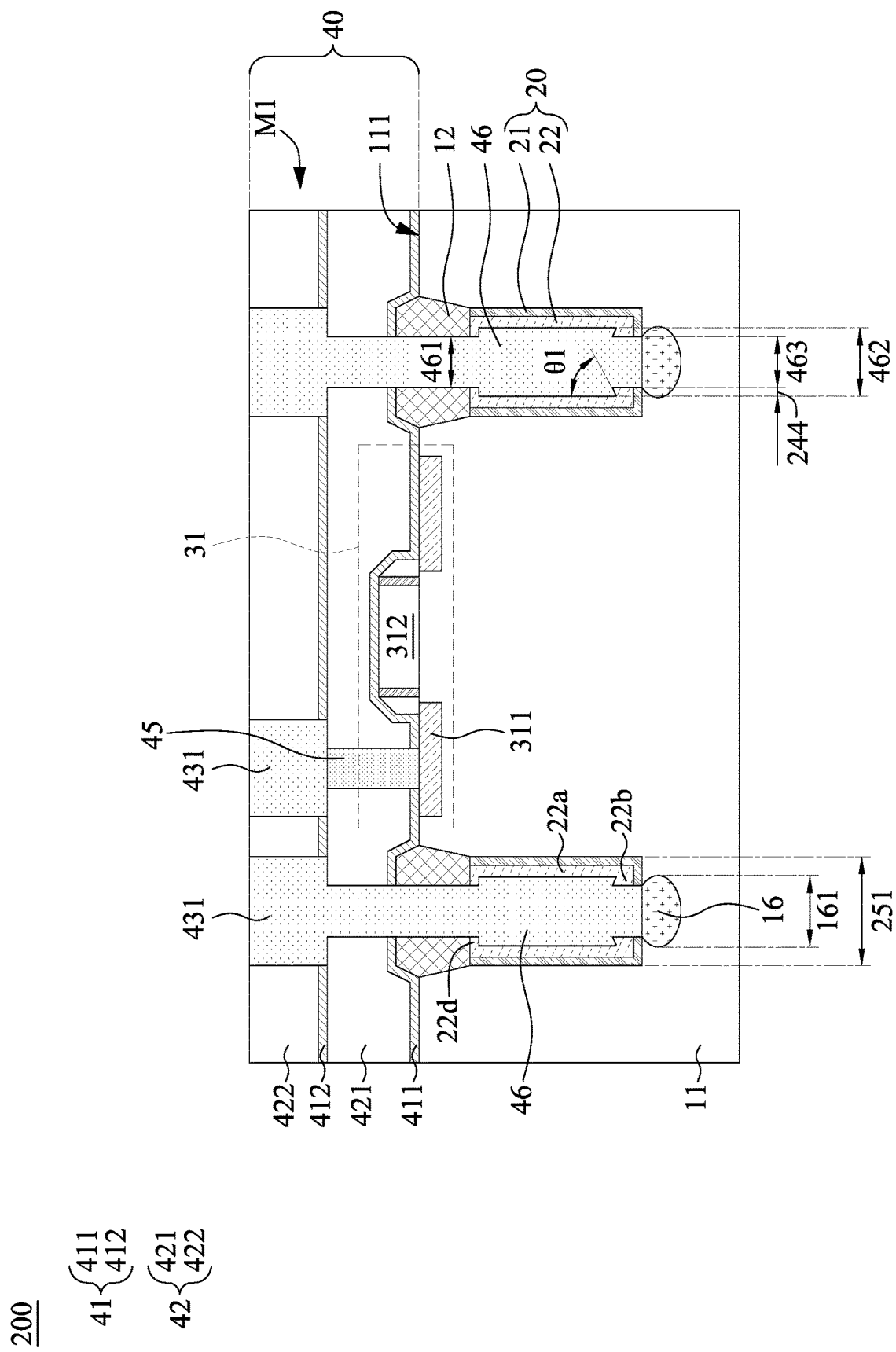
FIG. 2 is a schematic cross-sectional diagram of a semiconductor structure in accordance with some embodiments of the disclosure.

FIG. 2 is a schematic cross-sectional diagram of a semiconductor structure 100 in accordance with some embodiments of the present disclosure. The semiconductor structure 200 can be similar to the semiconductor structure 100 but can further include a conductive via 46 penetrating the DTI 20 and filling the gap 23 of the semiconductor structure 100 as shown in FIG. 1.

The conductive via 46 electrically connects to one of the metal line 431 of the metal line layer M1. In some embodiments, the conductive via 46 penetrates the ILD layer 421, the etch stop layer 411, the STI 12 and the DTI 20. In some embodiments, the conductive via 46 penetrates the DTI 20 and the STI 12 and fills the gap 23 as shown in FIG. 1. In some embodiments, the conductive via 46 is surrounded by the dielectric layer 21 and the dielectric layer 22. In some embodiments, the conductive via 46 penetrates the bottom portion 22b of the dielectric layer 22 and a portion of the dielectric layer 21 disposed thereunder. In some embodiments, a top width 461 of the conductive via 46 surrounded by the STI 12 is less than a middle width 462 of the conductive via 46 surrounded by the vertical portion 22a of the dielectric layer 22. In some embodiments, a range of the top width 461 may be substantially equal to that of the width 241 of the cap portion 22c of the dielectric layer 22. In some embodiments, the middle width 462 may be substantially equal to a width of the gap 23. In some embodiments, the width of the gap 23 is in a range of 0 to 18 µm. In some embodiments, a bottom width 463 of the conductive via 46 surrounded by the bottom portion 22b is greater than the top width 461 of the conductive via 46. In some embodiments, the bottom width 463 is in a range of 1 to 18 µm. In some embodiments, the bottom portion 22b is narrower than the vertical portion 22a by a distance 244 in a range of 0 to 1 µm. In some embodiments, an angle θ1 between the vertical portion 22a and the bottom portion 22b is less than 90 degrees, and the conductive via 46 includes a barbed configuration proximal to the bottom of the DTI 20.

The semiconductor structure 200 may further include a doping region 16 disposed in the substrate 11 under the DTI 20. In some embodiments, the doping region 16 is at the bottom of the DTI 20. In some embodiments, the doping region 16 is within a coverage area of the DTI 20. In some embodiments, a width 161 of the doping region 16 is less than the width 251 of the DTI 20. The doping region 16 may have a conductivity type same as that of the substrate 11. In some embodiments, the doping region 16 includes a P-type dopant, such as boron (B), gallium (Ga), indium (In), other suitable P-type dopants, or a combination thereof. In some embodiments, the doping region 16 includes an N-type dopant, such as phosphorus (P), arsenic (As), antimony (Sb), bismuth (Bi), other suitable N-type dopants, or a combination thereof. In some embodiments, a doping concentration of the doping region 16 is in a range of 1E18 to 1E21 atoms/cm$^3$. The conductive via 46 may electrically connect to the doping region 16 for a purpose of controlling a voltage of the substrate 11. In some embodiments, the conductive via 46 is in physical contact with the doping region 16.

A method of manufacturing a semiconductor structure similar to the semiconductor structure 100 and/or the semiconductor structure 200 is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 3:
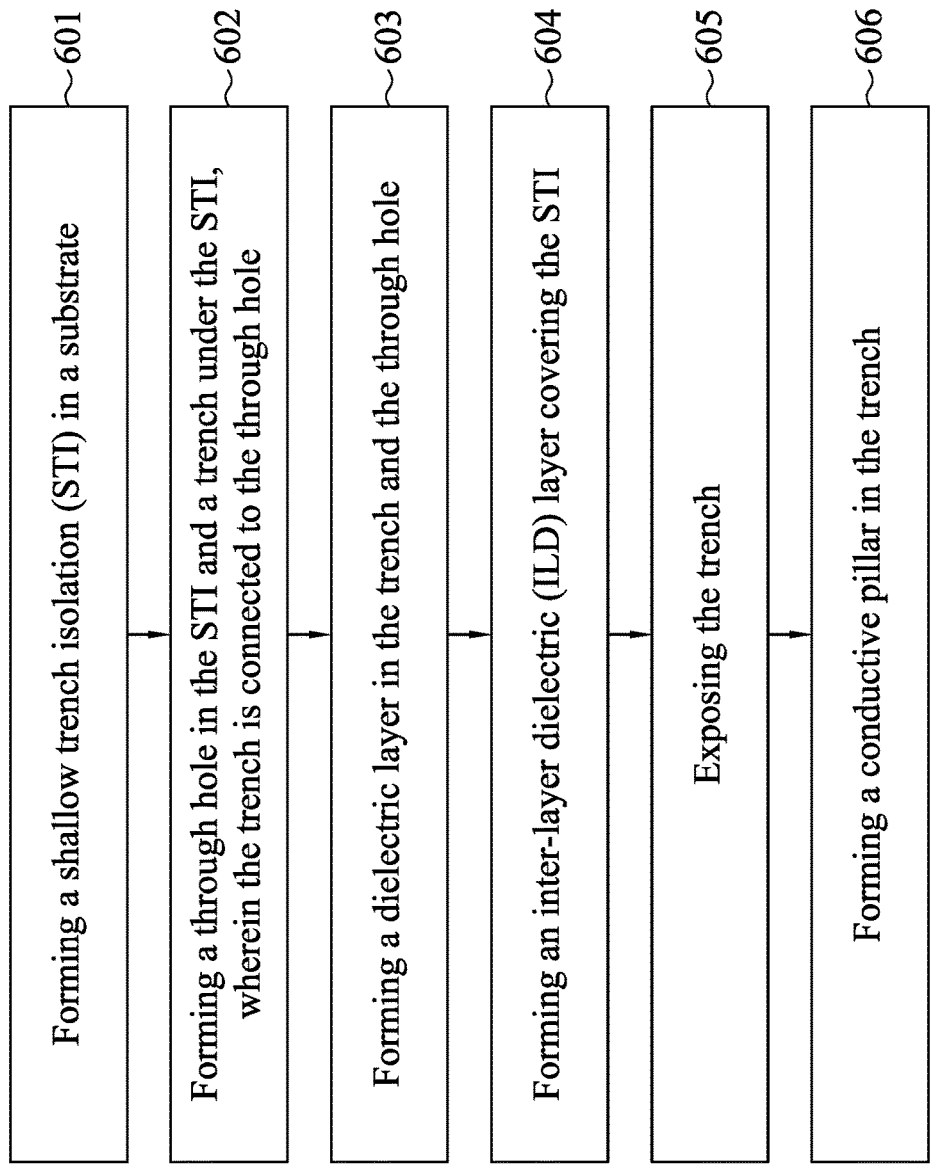
FIG. 3 is a flow diagram of a method of manufacturing a semiconductor structure in accordance with some embodiments of the disclosure.

FIG. 3 is a flow diagram of a method 600 for manufacturing a semiconductor structure in accordance with some embodiments of the present disclosure. The method 600 includes a number of operations (601, 602, 603, 604, 605 and 606) and the description and illustration are not deemed as a limitation to the sequence of the operations. In the operation 601, a shallow trench isolation (STI) is formed in a substrate. In the operation 602, a through hole in the STI and a trench under the STI are formed, wherein the trench is connected to the through hole. In the operation 603, a dielectric layer is formed in the trench and the through hole. In the operation 604, an inter-layer dielectric (ILD) layer covering the STI is formed. In the operation 605, the trench is exposed. In the operation 606, a conductive pillar is formed in the trench. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

Figure 4:
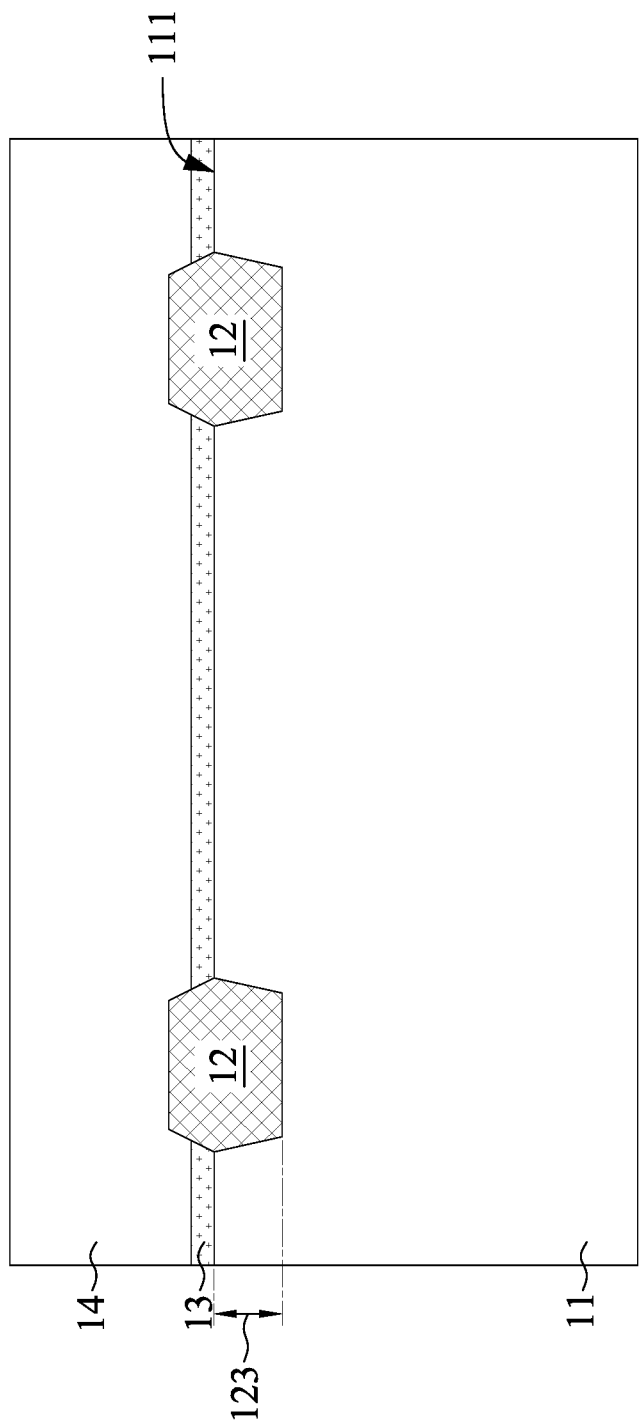
FIGS. 4 to 15 are schematic cross-sectional diagrams of a semiconductor structure at different stages of a manufacturing method in accordance with some embodiments of the disclosure.

Please refer to FIG. 4, which is a schematic cross-sectional diagram at a stage of the method 600 in accordance with some embodiments of the present disclosure. In the operation 601, one or more STIs 12 are formed in a substrate 11. The STI 12 can be formed by a conventional method, and is not limited herein. For instance, one or more portions of the substrate 11 are removed, e.g., by an etching operation, and a dielectric material fills the spaces of the removed portions of the substrate 11. In some embodiments, the STI 12 is formed by a deposition operation. In some embodiments, the STI include oxide, nitride, oxynitride, other suitable dielectric materials, or a combination thereof. In some embodiments, a depth 123 of the STI 12 from a top surface 111 of the substrate 11 is in a range of 0.1 to 0.5 µm.

After the operation 601, a mask layer 14 may be formed over the top surface 111 of the substrate 11 covering the STI 12 for a purpose of defining an opening 24 of the STI 12 in subsequent processing. A pad oxide layer 13 is optionally formed on the top surface 111 of the substrate 11 prior to the formation of the mask layer 14. In some embodiments, the mask layer 14 includes a dielectric material different from that of the STI 12. In some embodiments, the mask layer 14 includes silicon nitride and the STI 12 includes silicon oxide. The pad oxide layer 13 may be formed for a purpose of stress reduction between the mask layer 14 and the substrate 11, especially when the mask layer 14 includes nitride.

Figure 5:
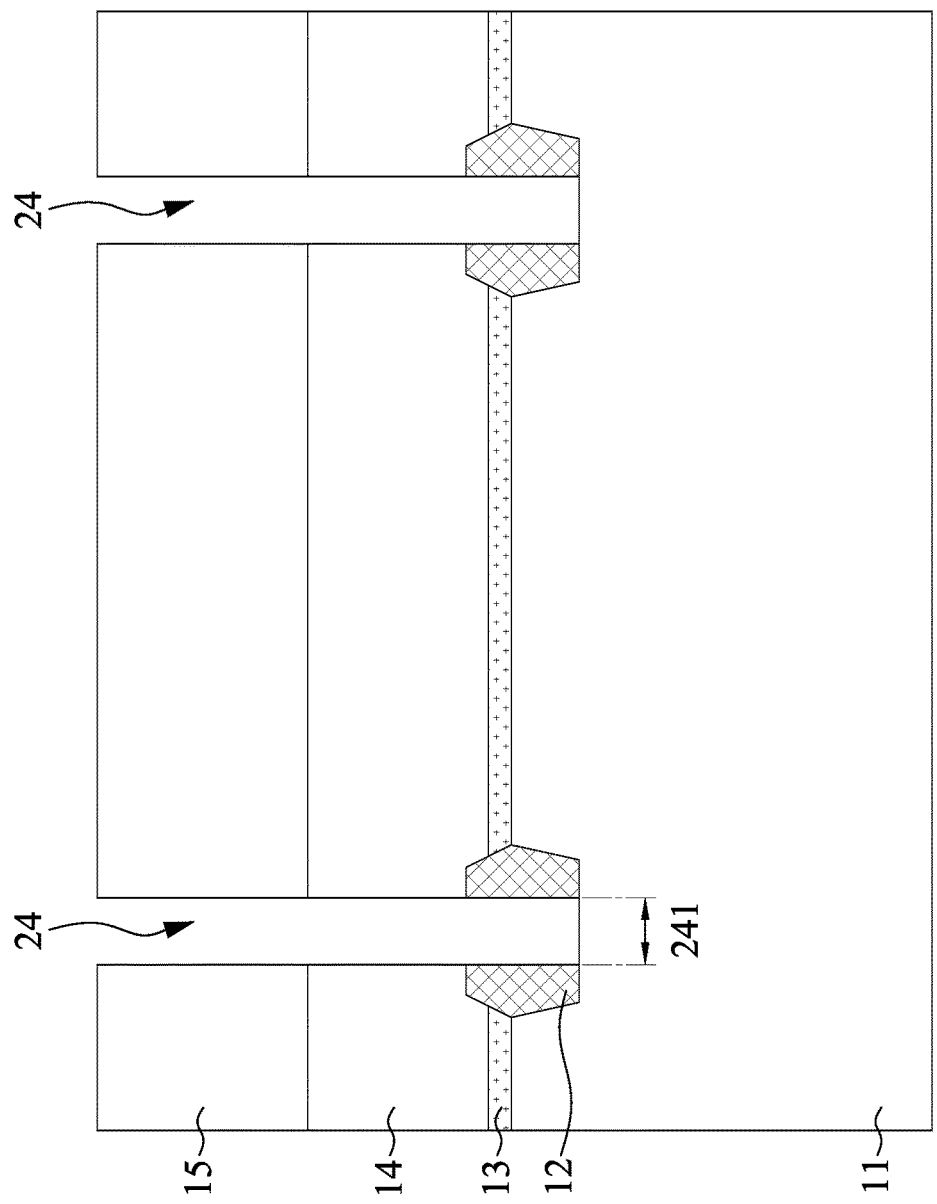

Please refer to FIG. 5, which is a schematic cross-sectional diagram at a stage of the method 600 in accordance with some embodiments of the present disclosure. In the operation 602, an opening 24 is formed in the STI 12. In some embodiments, a photoresist layer 15 is formed over the mask layer 14 in order to define the opening 24. One or more etching operations may be performed on the mask layer 14 and the STI 12 to form the opening 24. In some embodiments, an etching operation having a low oxide-to-nitride selectivity is performed to remove a portion of the mask layer 14 and a portion of the STI 12 concurrently. In some embodiments, the portion of the mask layer 14 and the portion of the STI 12 are removed by different etching operations performed in sequence. The opening 24 penetrates the STI 12 and stops at the substrate 11. In some embodiments, the etching operation to remove the portion of the STI 12 has a low selectivity to a material of the substrate 11 and stops at an exposure of the substrate 11. The opening 24 may be referred to as a through hole 24 of the STI 12. In some embodiments, a width 242 of the opening 24 is in a range of 0.1 to 10 μm.

Figure 6:
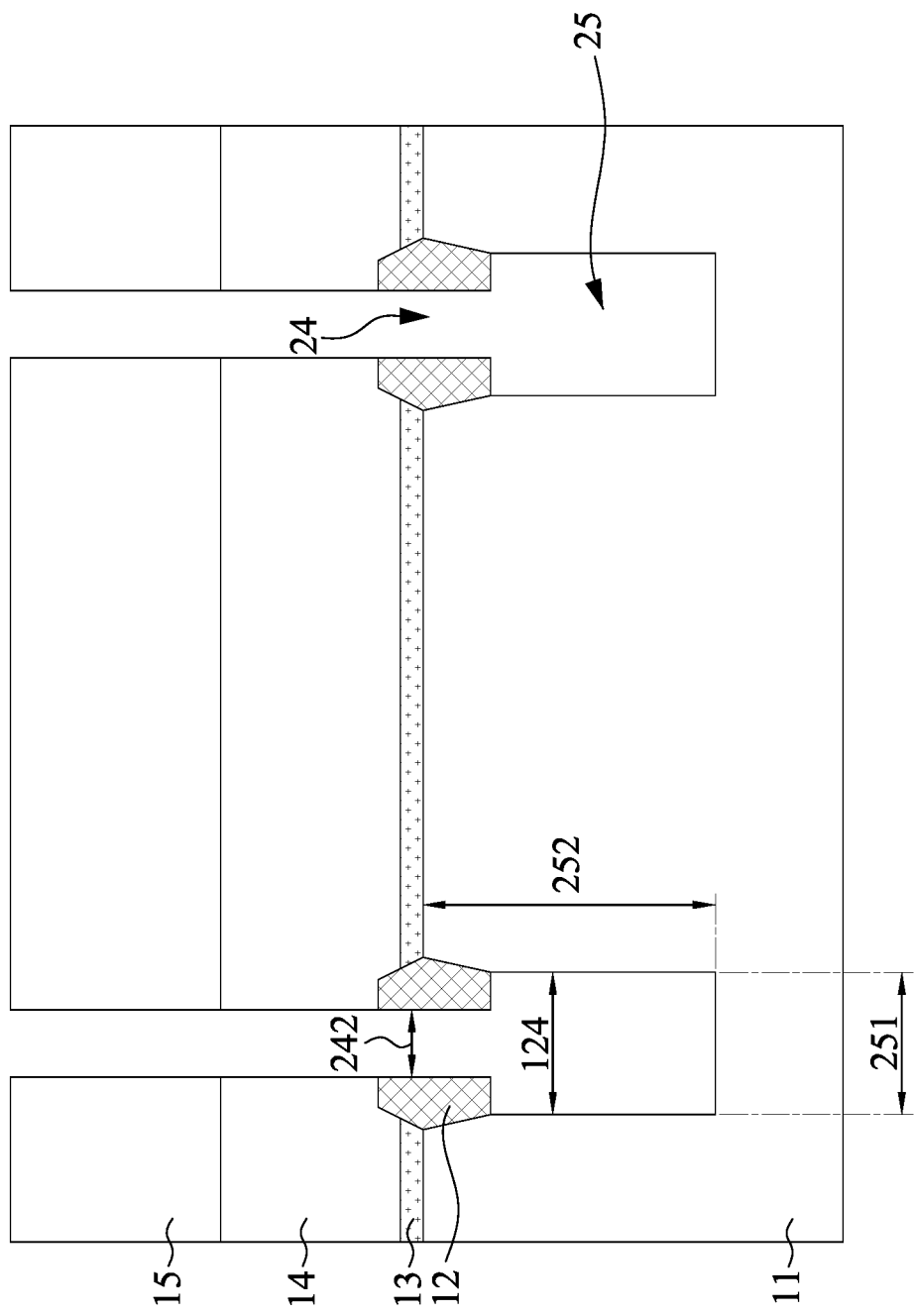

Please refer to FIG. 6, which is a schematic cross-sectional diagram at a stage of the method 600 in accordance with some embodiments of the present disclosure. In the operation 602, a trench 25 is formed in the substrate 11 under the STI 12. In some embodiments, an etching operation having a high selectivity to the material of the substrate 11 is performed to remove a portion of the substrate 11 below the STI 12. A width 251 of the trench 25 may be substantially greater than the width 242 of the opening 24. In some embodiments, at least a portion of a bottom of the STI 12 is exposed in the trench 25. In some embodiments, a sidewall of the trench 25 is aligned with an edge of the bottom of the STI 12 as shown in FIG. 6. In other embodiments, the sidewall of the trench 25 may surround or be covered by the bottom of the STI 12. The width 251 can be greater than or less than a width 124 the bottom of the STI 12, and is not limited herein. In some embodiments, a depth 252 of the trench 25 from the top surface 111 of the substrate 11 is in a range of 0.3 to 50 μm. In some embodiments, the width 251 of the trench 25 is less than the depth 252 and is in a range of 0.1 to 20 μm. It should be noted that a configuration of the trench 25 shown in the figures are for a purpose of illustration. The trench 25 can be tapered, rounded, in an 8-shape, or in other configurations depending on the etching operation according to different applications. In some embodiments, the photoresist layer 15 remains on the mask layer 14 during the formation of the trench 25 as shown in FIG. 6, and is removed thereafter. In some embodiments, the photoresist layer 15 is removed prior to or after the formation of the trench 25.

Figure 7:
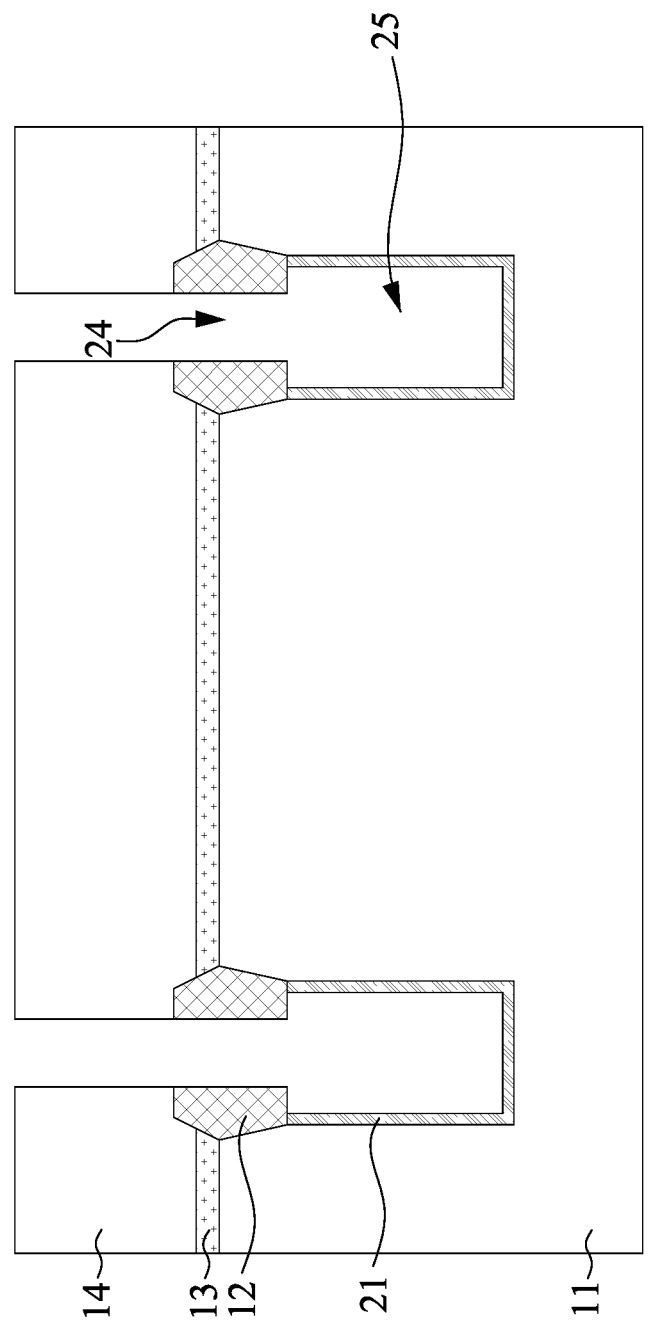
Figure 8:
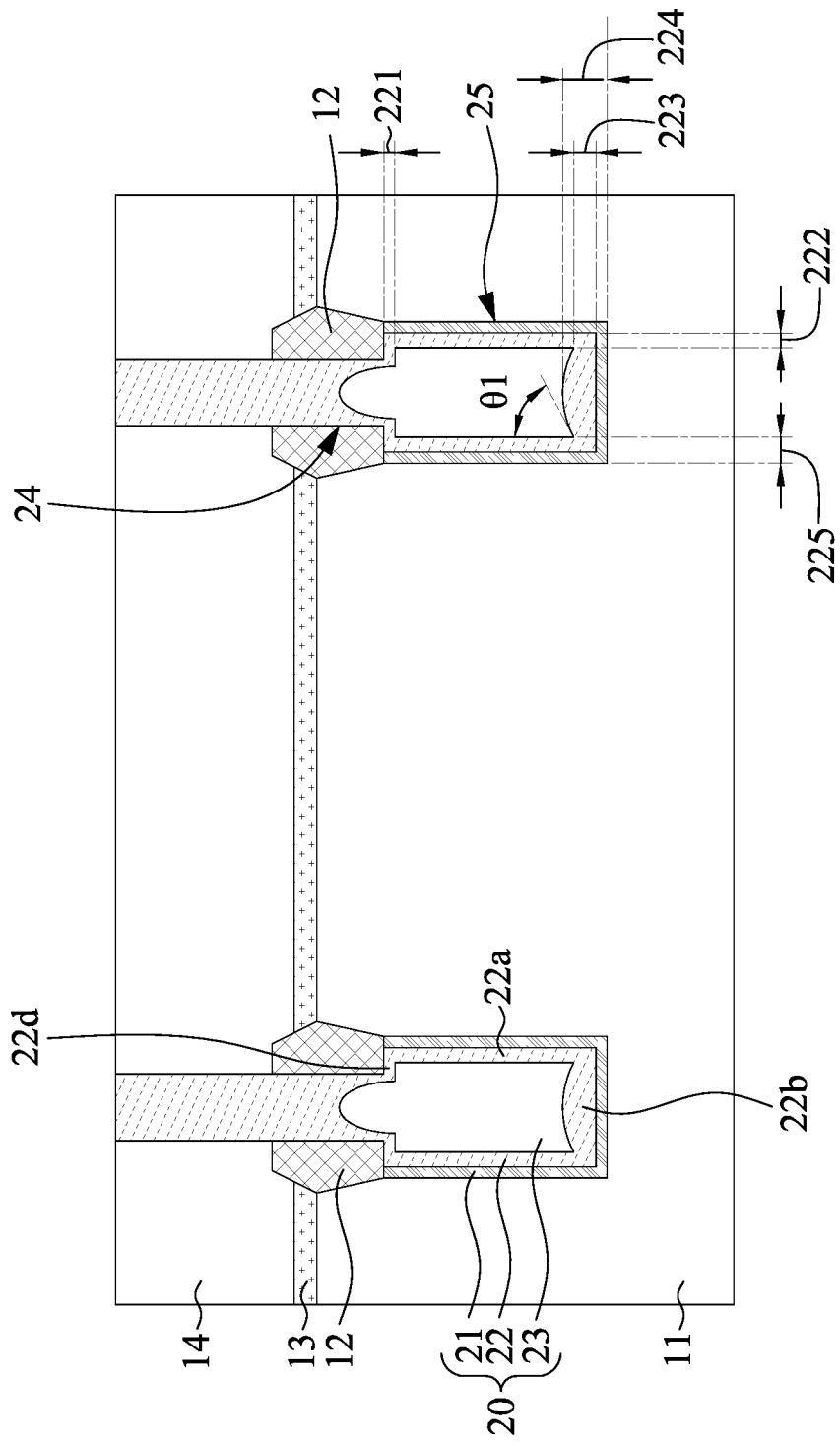

Please refer to FIGS. 7 and 8, which are schematic cross-sectional diagrams at different stages of the method 600 in accordance with some embodiments of the present disclosure. In the operation 603, a dielectric layer 22 is formed in the trench 25 and the opening 24. A dielectric layer 21 may be optionally formed over the sidewalls and a bottom of the trench 25 prior to the formation of the dielectric layer 22 in the trench 25. In some embodiments, the dielectric layer 21 is formed by a thermal oxidation. In some embodiments, the dielectric layer 21 is formed by a linear deposition followed by an annealing operation. In some embodiments, the dielectric layer 21 is formed by oxidation of the substrate 11, and the dielectric layer 21 lines the trench 25 below the STI 12 as shown in FIG. 7. As shown in FIG. 8, the dielectric layer 22 may be formed by a low-temperature deposition operation. The dielectric layer 22 is auto-sealed at the opening 24 of the STI 12, and various thicknesses of different portions of the dielectric layer 22 in the trench 25 are provided due to a property of the deposition operation. A gap 23 is thereby defined by the dielectric layer 22. A cap portion 22c of the dielectric layer 22 is disposed in the opening 24 and defines a top of the gap 23. A thickness 221 of a top portion 22d of the dielectric layer 22 at the bottom of the STI 12, a thickness 222 of a vertical portion 22a of the dielectric layer 22 at the sidewall of the trench 25, a thickness 223 of a bottom portion 22b of the dielectric layer 22 at the bottom of the trench 25, a total thickness 225 of the dielectric layers 22 and 21 at the sidewall of the trench 25, and a total thickness 224 of the dielectric layers 22 and 21 measured at a middle of the bottom of the trench 25 can be similar to those described above and illustrated in FIG. 1. In addition, due to the property of the deposition, an angle θ1 between the vertical portion 22a and the bottom portion 22b can be substantially equal to or less than 90 degrees as described above and illustrated in FIG. 1, and repeated description is omitted herein. The gap 23 may include a convex top surface and a concave bottom surface toward a top 121 of the STI 12 or the surface 111 of the substrate 11. In some embodiments, a convex portion of the gap 23 is disposed in the opening 24. The dielectric layers 21 and 22 and the gap 23 together define a DTI 20 in the substrate 11 below the STI 12. A boundary of the dielectric layer 22 and the STI 12 may or may not be observed by an electron microscope depending on materials of the dielectric layer 22 and the STI 12. In some embodiments, it is observed that a portion of the DTI 20 penetrates the STI 12. In some embodiments, it is observed that the DTI 20 extends from the bottom of the STI 12.

Figure 9:
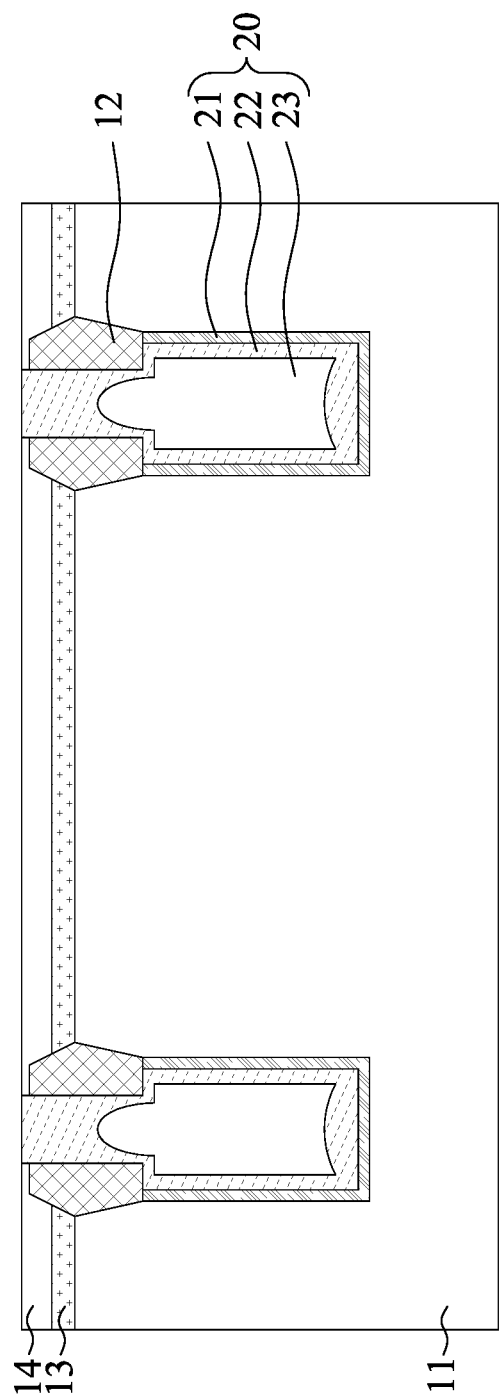
Figure 10:
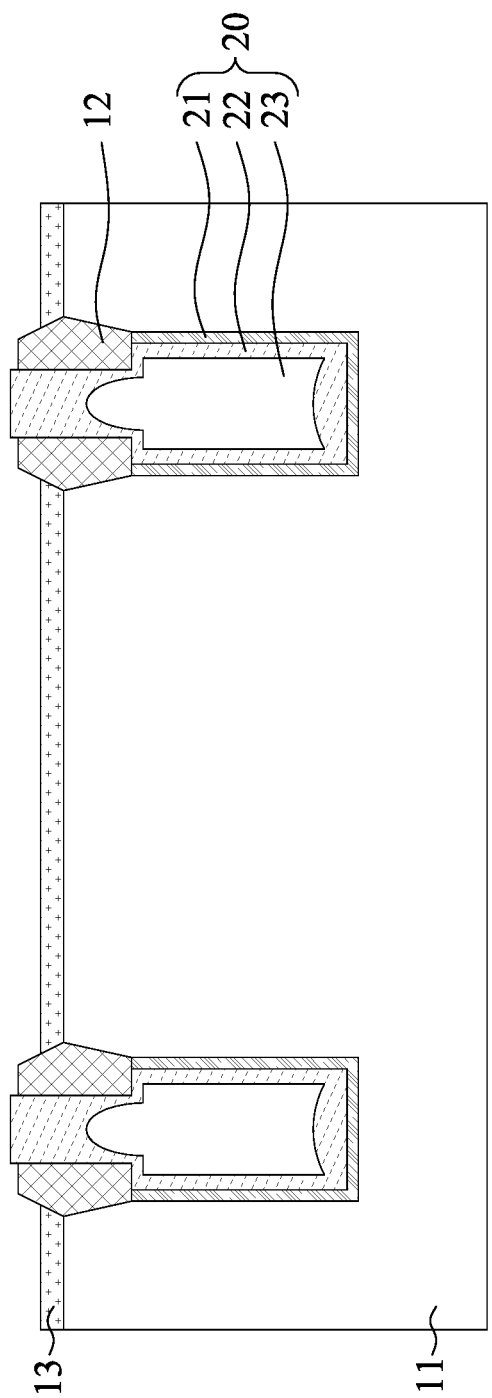
Figure 11:
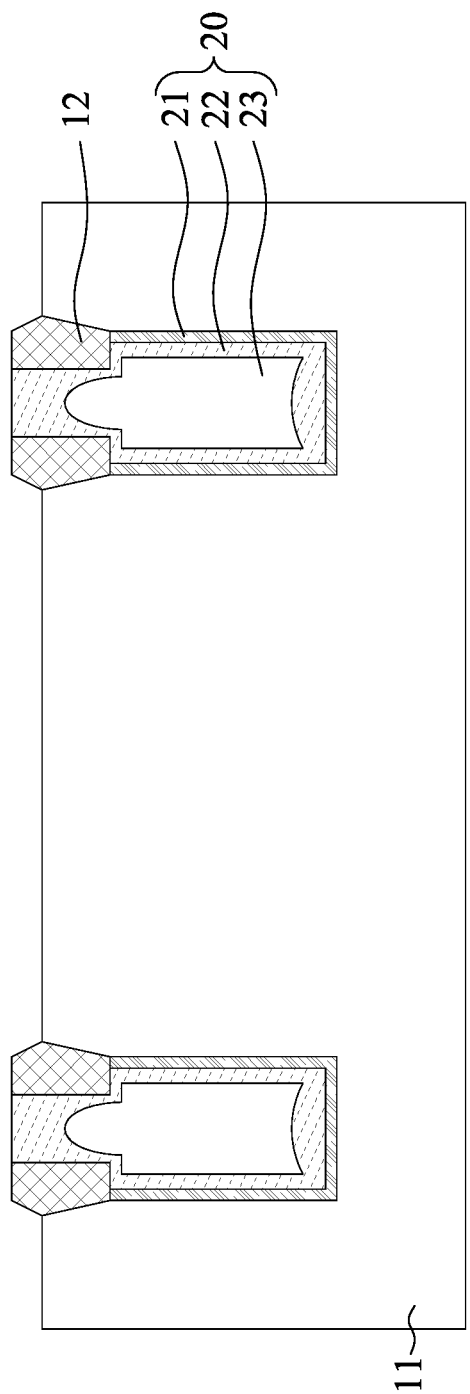

Please refer to FIGS. 9 to 11, which are schematic cross-sectional diagrams at different stages of the method 600 in accordance with some embodiments of the present disclosure. After the formation of the DTI 20, multiple operations are performed to remove the mask layer 14 and the pad oxide layer 13 over the substrate 11. As shown in FIG. 9, a polishing operation is performed to remove a portion of the mask layer 14 above the STI 12. In some embodiments, the polishing operation includes chemical mechanical polishing (CMP). A first etching operation may be then performed on a remaining portion of the mask layer 14 in FIG. 9, and the mask layer 14 is removed as shown in FIG. 10. In some embodiments, the etching operation includes a dry etching operation, a wet etching operation, a directional plasma etching operation, or a combination thereof. In some embodiments, the first etching operation has a high selectivity to a material of the mask layer 14. In some embodiments, the first etching operation has a high selectivity to nitride. A second etching operation may be performed after the first etching operation to remove the pad oxide layer 13 and optionally remove surficial portions of the dielectric layer 22 and the STI 12, and the top surface 111 of the substrate 11 is thereby exposed. The surficial portions of the dielectric layer 22 and the STI 12 may be damaged during processing, and the second etching operation can remove the damaged surficial portions of the dielectric layer 22 and the STI 12. In some embodiments, the pad oxide layer 13, the dielectric layer 22 and the STI 12 include oxide, and the second etching operation has a high selectivity to oxide.

Figure 12:
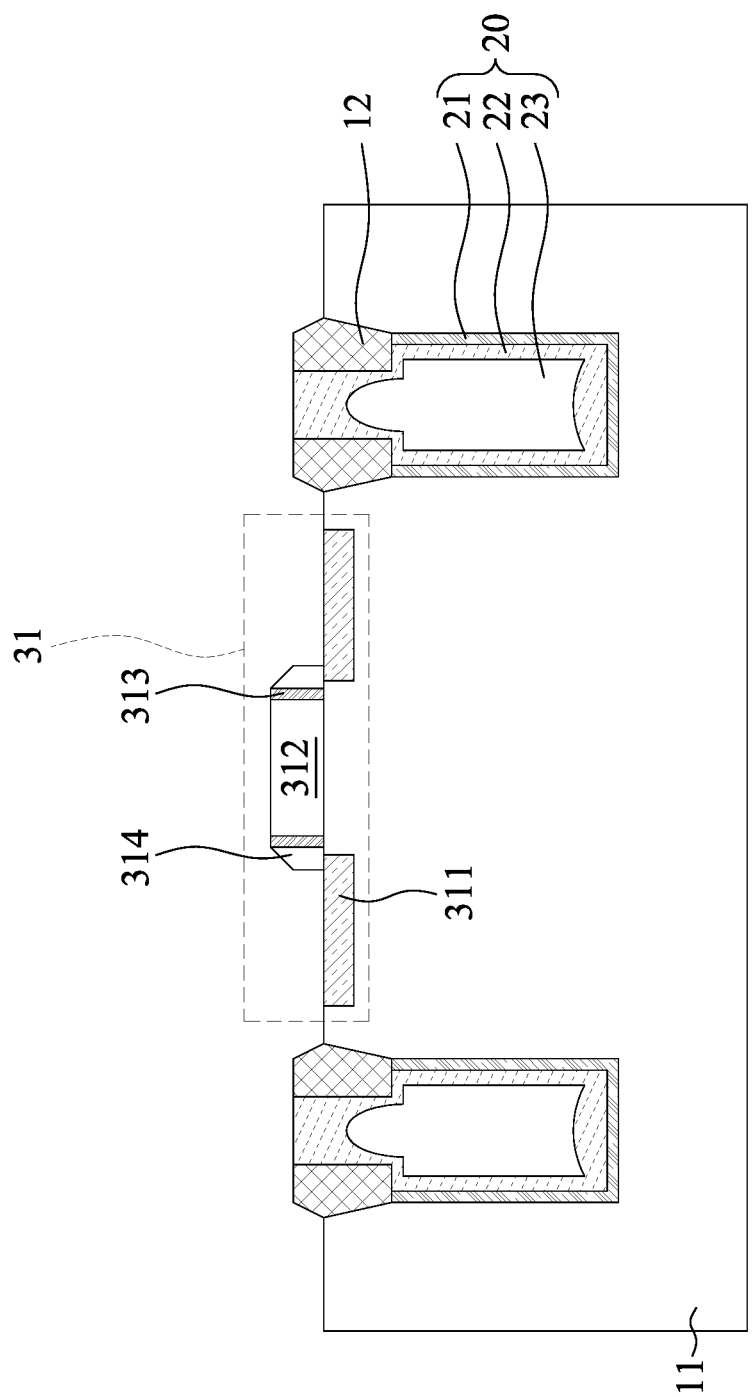

Please refer to FIG. 12, which is a schematic cross-sectional diagram at a stage of the method 600 in accordance with some embodiments of the present disclosure. After the exposure of the top surface 111 of the substrate 11, one or more transistors 31 are formed over the substrate 11 between the STIs 12. The transistor 31 may represent one or more electrical components. In some embodiments, the transistor(s) 31 is designed to be a high-voltage device, e.g., a CMOS-based smart power device. As illustrated above in FIG. 1, for a purpose of simplicity, a planar transistor is depicted as the transistor 31 in the figures as an exemplary embodiment of an electrical component, but such depiction is not intended to limit the present disclosure. In some embodiments, the transistor 31 includes source/drain regions 311 disposed in the substrate 11, a gate structure 312 disposed at a surface 111 of the substrate 11 between the source/drain regions 311, and a spacer structure (e.g., 313 and 314) surrounding the gate structure 312. The gate structure 312 can be a P-type metal gate or an N-type metal gate. In some embodiments, the gate structure 312 includes one or more work function layers (not shown). In some embodiments, the spacer structure includes a first spacer 313 surrounding the gate structure 312 and a second spacer 314 surrounding the first spacer 313.

Figure 13:
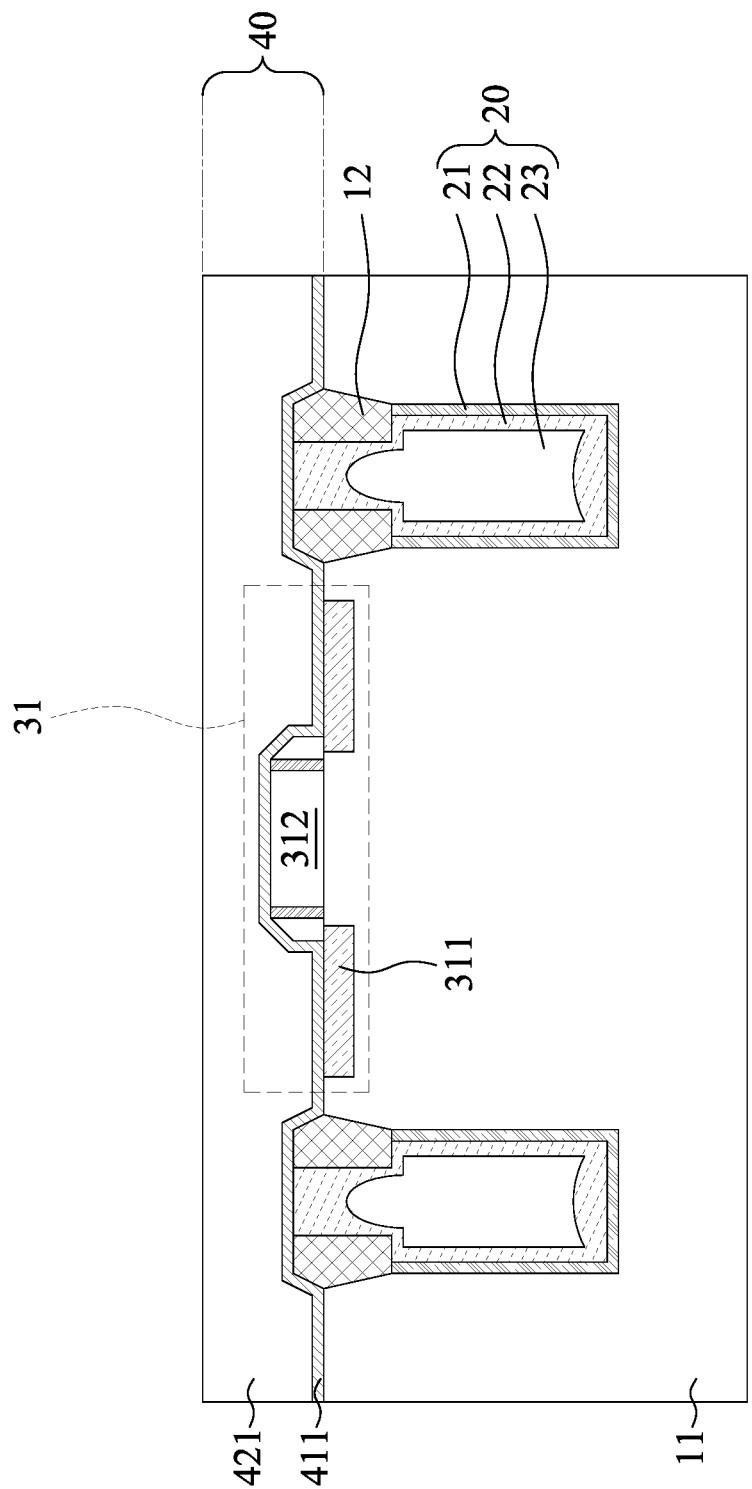

Please refer to FIG. 13, which is a schematic cross-sectional diagram at a stage of the method 600 in accordance with some embodiments of the present disclosure. In the operation 604, an ILD layer 421 is formed over the substrate 11 covering the transistor 31, the STI 12 and the DTI 20. In some embodiments, an etch stop layer 411 is formed conformal to the substrate 11, the transistor 31 and the STI 12 prior to the formation of the ILD layer 421. An interconnect structure 40 may include a plurality of metal via layers arranged alternatingly between a plurality of metal line layers for electrical connection between the metal line layers. Each metal line layer may be formed of metal lines and an ILD layer (which may be referred to as intermetal dielectric (IMD) layer) surrounding the metal lines. Similarly, each metal via layer may be formed of a metal via and an ILD layer (or IMD layer) surrounding the metal vias. The ILD layer 421 shown in the figures can be a first ILD layer of the interconnect structure 40 over the substrate 11. For a purpose of processing, an etch stop layer is formed prior to the formation of each of the ILD layers, and the etch stop layer 411 may be the first etch stop layer of the interconnect structure 40 over the substrate 11.

Figure 14:
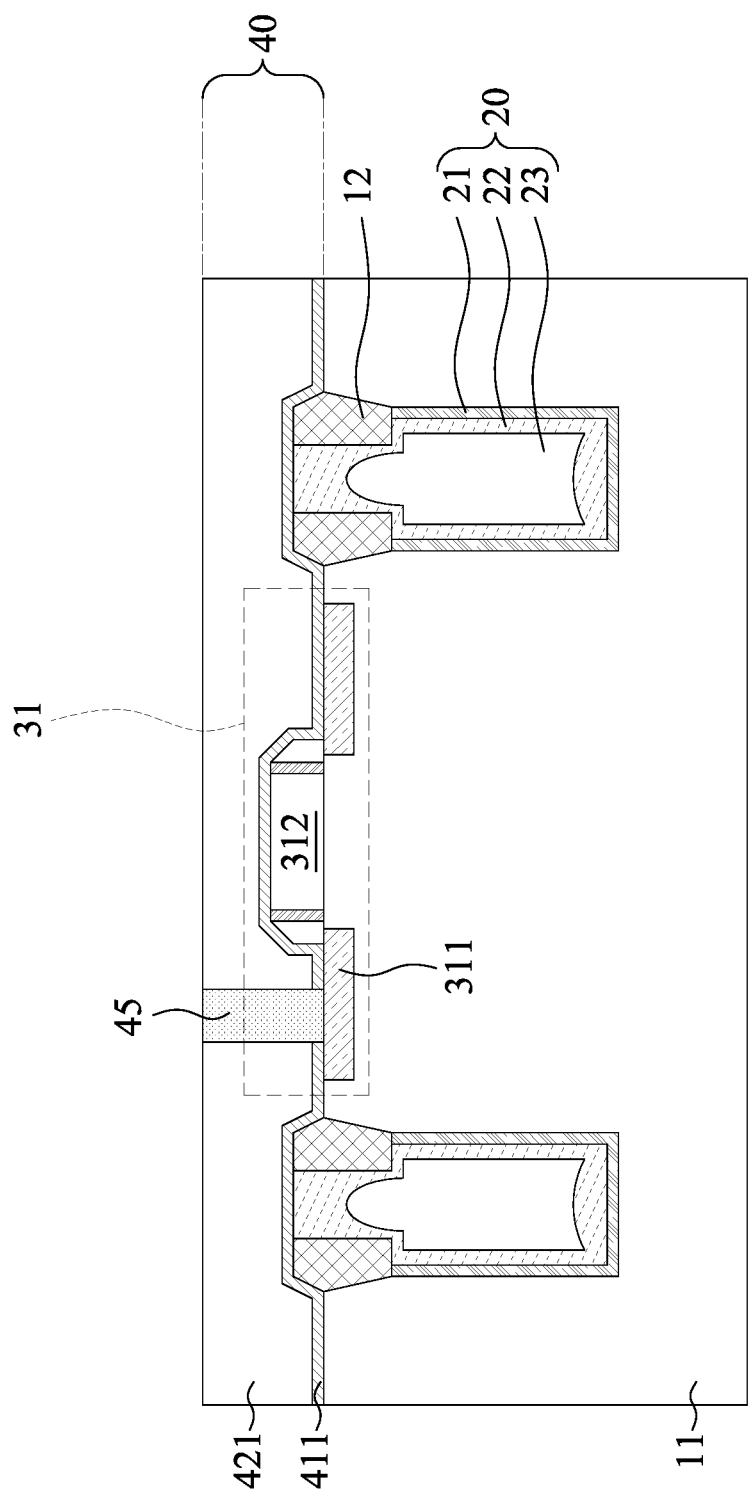

Please refer to FIG. 14, which is a schematic cross-sectional diagram at a stage of the method 600 in accordance with some embodiments of the present disclosure. After the operation 604, a contact via 45 is formed in the ILD 421. In some embodiments, portions of the ILD layer 421 and the etch stop layer 411 are removed, and a deposition of conductive material is performed to form the contact via 45. The contact via 45 is for electrical connection to the transistor 31. In some embodiments, the contact via 45 is electrically connected to the source/drain regions 311 as shown in FIG. 14. The interconnect structure 40 can include multiple contact vias 45 to electrically connect to the gate structure 312 of the transistor 31, although such configuration is not depicted in the figures for a purpose of simplicity. In some embodiments, a material of the contact via 45 includes copper (Cu), aluminum (Al), tungsten (W), manganese (Mn), cobalt (Co), titanium (Ti), tantalum (Ta), titanium nitride (TiN), tantalum nitride (TaN), other suitable composite metals, or a combination thereof.

Figure 15:
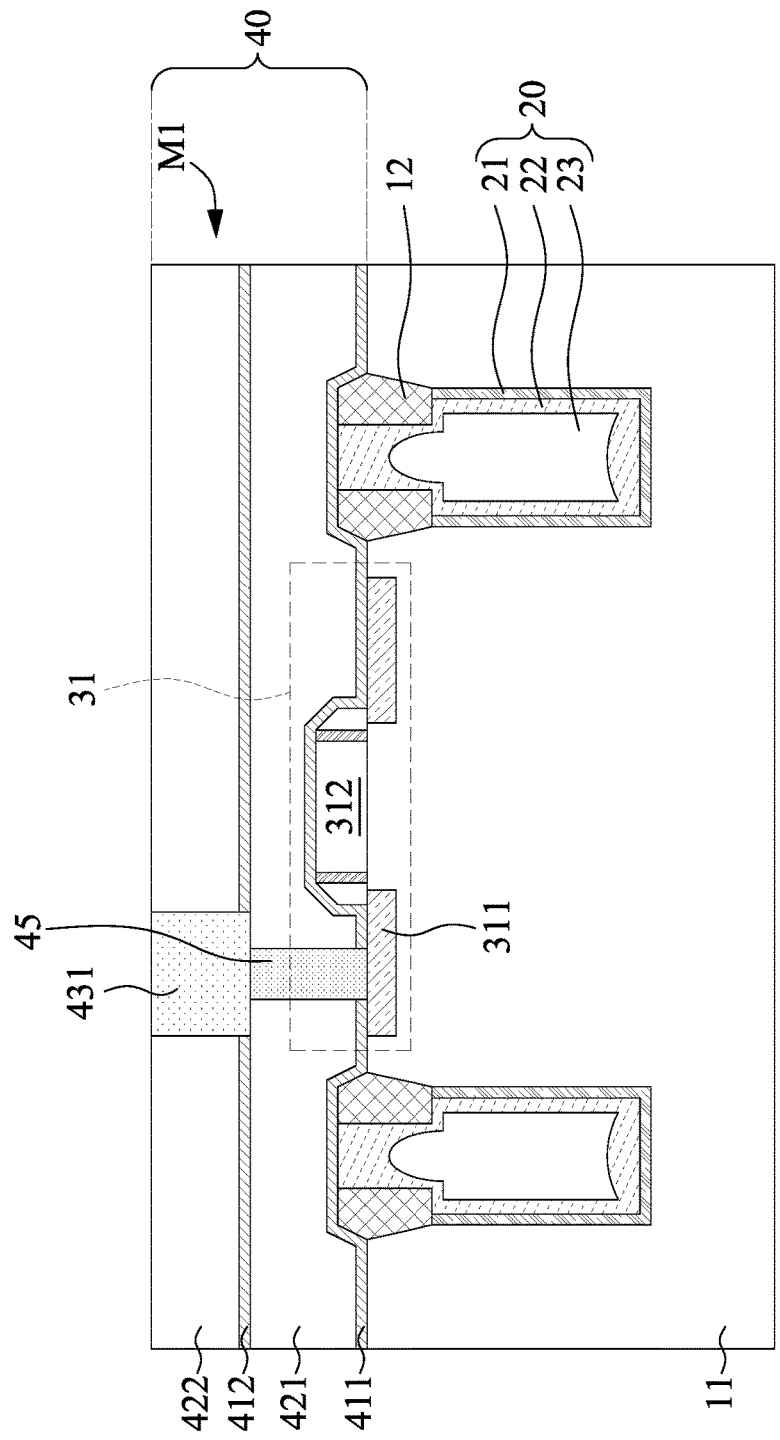

Please refer to FIG. 15, which is a schematic cross-sectional diagram at a stage of the method 600 in accordance with some embodiments of the present disclosure. After the formation of the contact via 45, an etch stop layer 412, an ILD 422, and a metal line 431 of the interconnect structure 40 are formed over the ILD 421. In some embodiments, the contact via 45 is electrically connected to the metal line 431 in a first metal layer M1 of the interconnect structure 40. A conventional method of forming an interconnect structure can be applied, and detailed description is omitted herein. For instance, depositions are sequentially performed to form the etch stop layer 412 and the ILD layer 422. One or more etching operations are performed to remove portions of the ILD layer 422 and the etch stop layer 412, and a conductive material is then deposited in spaces of the removed portions of the ILD layer 422 and the etch stop layer 412 to form the metal line 431. In some embodiments, the operations 605 and 606 are omitted, and a semiconductor structure 300 similar to the semiconductor structure 100 is thereby formed. The semiconductor structure 300 includes the DTI 20, which has the gap 23 sealed by the dielectric layer 22, and can be applied in a high-voltage device for improved performance.

In alternative embodiments, a conductive via 46 is formed in the gap 23 to electrically connect to the substrate 11 and the interconnect structure 40. Please refer to FIG. 16, which is a schematic cross-sectional diagram at a stage of the method 600 in accordance with some embodiments of the present disclosure. After the operation 604, the operation 605 is performed on the intermediate structure shown in FIG. 14. In the operation 605, one or more etching operations are performed to expose the gap 23 and the substrate 11. The one or more etching operations may include a directional dry etching operation, an ion beam etching (IBE), a reactive ion etching (RIE), a directional plasma etching, or a combination thereof. In some embodiments, a portion of the ILD 421 covering the cap portion 22c of the dielectric layer 22 is removed to form an opening 26 over the STI 12. In some embodiments, the cap portion 22c of the dielectric layer 22 within the STI 12 is removed, and the opening 24 is re-formed. In some embodiments, portions of the dielectric layers 22 and 21 vertically overlapped by the opening 26 are also removed to from an opening 27 under the gap 23. The opening 26, the opening 24, the gap 23 and the opening 27 are interconnected or in fluid communication, and a portion of the substrate 11 at the bottom of the DTI 20 is exposed by the opening 27. In some embodiments, a width 271 of the opening 27 is in a range of 1 to 18 μm. The bottom portion 22b of the dielectric layer 22 may be partially or entirely removed. In some embodiments, a horizontal length 244 of the remaining bottom portion 22b extending from the vertical portion 22a is in a range of 0 to 1 μm.

Figure 17:
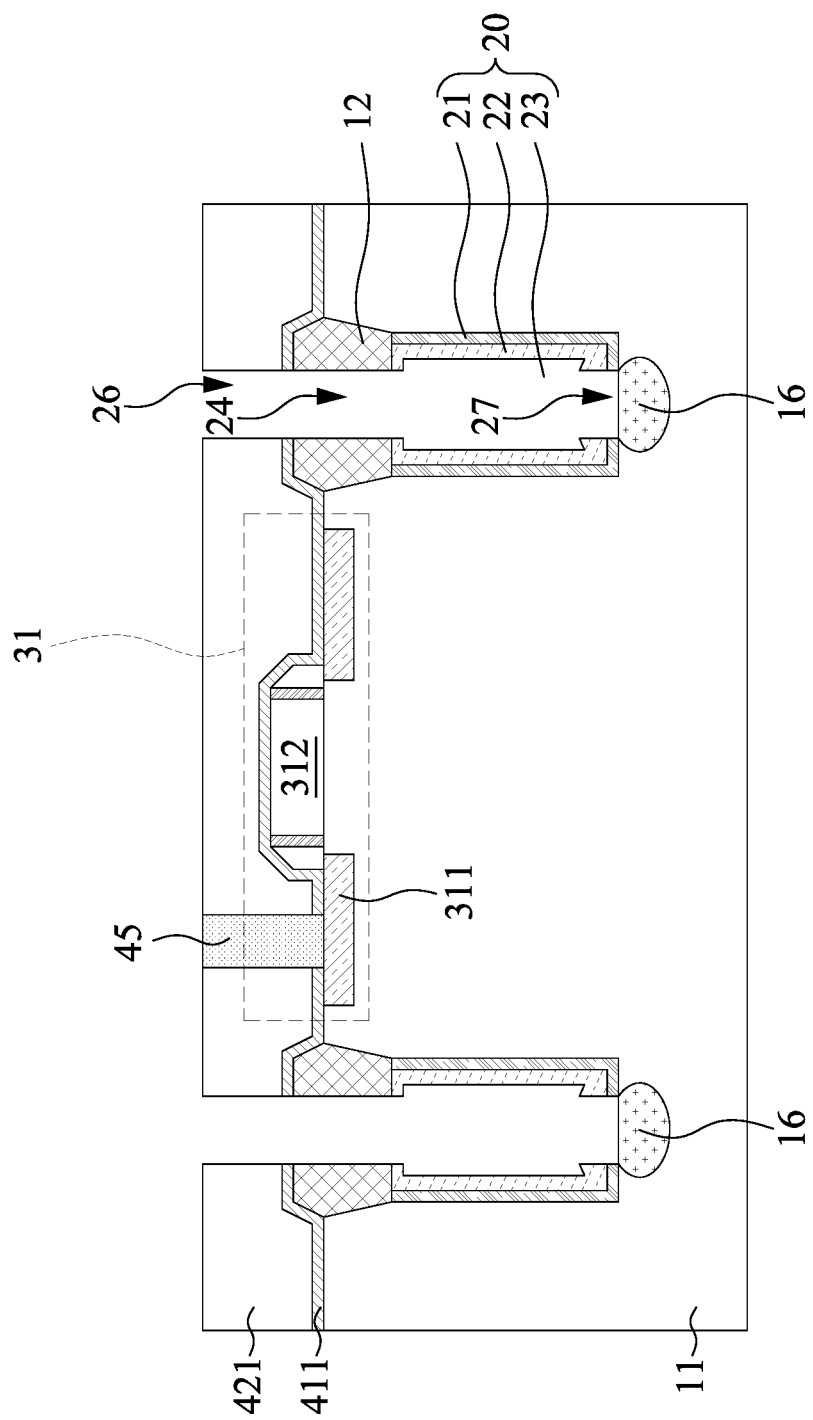

Please refer to FIG. 17, which is a schematic cross-sectional diagram at a stage of the method 600 in accordance with some embodiments of the present disclosure. After the operation 605, an implantation is performed to form a doping region 16 in the exposed portion of the substrate 11 at the bottom of the DTI 20. The doping region 16 is to reduce a contact resistance between the substrate 11 and a conductive pillar 46 formed in subsequent processing. The implantation may include a P-type dopant or an N-type dopant depending on a conductivity type of the substrate 11. In some embodiments, a concentration of the doping region 16 is in a range of 1E18 to 1E21 atoms/cm$^3$. In some embodiments, the implantation is provided across the substrate 11, and the doping region 16 is self-aligned in the exposed portion of the substrate 11 at the bottom of the DTI 20.

Figure 18:
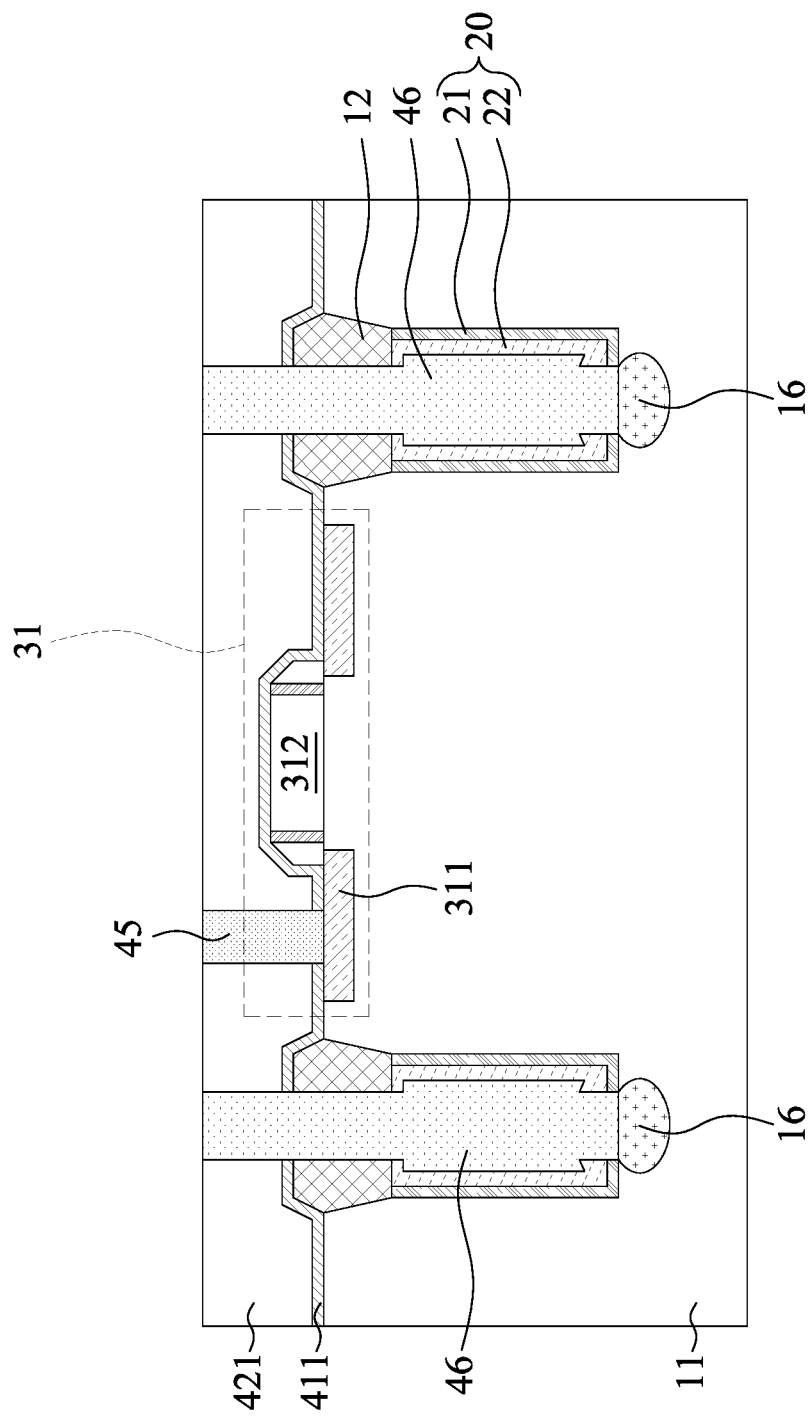

Please refer to FIG. 18, which is a schematic cross-sectional diagram at a stage of the method 600 in accordance with some embodiments of the present disclosure. In the operation 606, a conductive pillar 46 is formed in the gap 23. More specifically, the conductive pillar 46 fills the openings 26, 24 and 27 and the gap 23 shown in FIG. 17. In some embodiments, the conductive pillar 46 is formed by a deposition of a conductive material. In some embodiments, the conductive material includes titanium (Ti), tantalum (Ta), aluminum (Al), copper (Cu), tungsten (W), titanium nitride (TiN), tantalum nitride (TaN), other suitable composite metals, or a combination thereof. In some embodiments, a material of the conductive pillar 46 is different from that of the contact via 45. It should be noted that the above description illustrates the formation of the conductive pillar 46 being performed after the formation of the contact via 45. However, such description is an exemplary embodiment and is not intended to limit the present disclosure. In alternative embodiments, the formation of the conductive pillar 46 is performed prior to or concurrently with the formation of the contact via 45.

Figure 19:
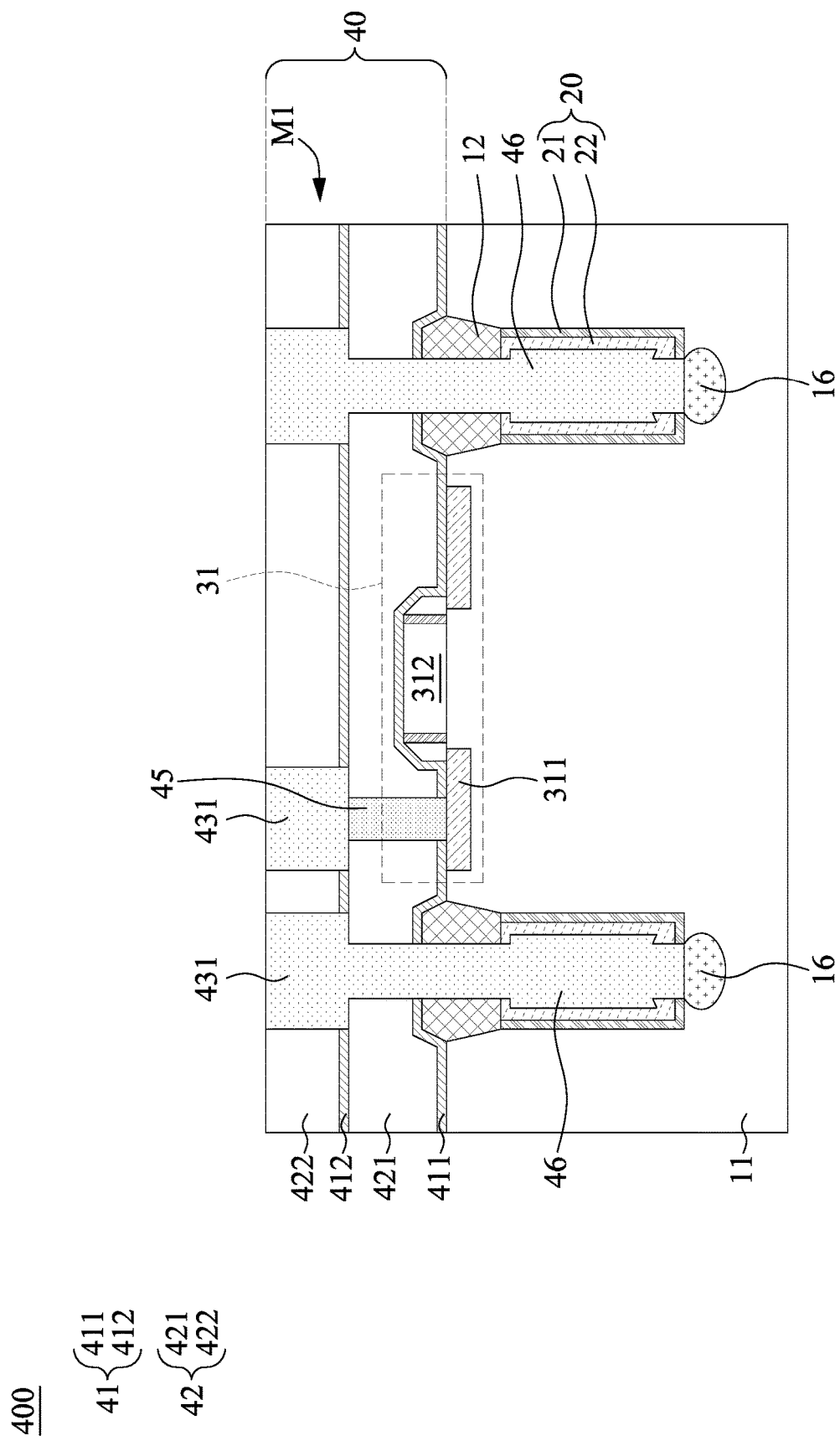

Please refer to FIG. 19, which is a schematic cross-sectional diagram at a stage of the method 600 in accordance with some embodiments of the present disclosure. After the operation 606, the operations depicted in FIG. 15 are performed to from multiple metal lines 431 electrically isolated and physically separated by an ILD 422 over the ILD 421. The metal lines 431 are disposed in a first metal line layer M1 of the interconnect structure 40. In some embodiments, an etch stop layer 412 is formed prior to formation of the ILD 422. The metal lines 431 penetrate the etch stop layer 412 to electrically connect to the conductive pillar 46 and the contact via 45. A semiconductor structure 400 similar to the semiconductor structure 200 is thereby formed. The semiconductor structure 400 includes the DTI 20 and the conductive pillar 46 penetrating the DTI 20, and can be applied in a high-voltage device (e.g., a device with an operation voltage greater than 100 volts) for improved performance.

The above description is for a purpose of illustration of the concept of the present disclosure, and the present disclosure is not limited to the embodiments as described above and illustrated in FIGS. 4 to 15 or FIGS. 4 to 14 and FIGS. 16 to 19. In order to achieve the purpose of the present disclosure as described above, in alternative embodiments, the conductive pillar 46 can be formed after the first metal line layer M1, or concurrently with the contact via 45.

Figure 20:
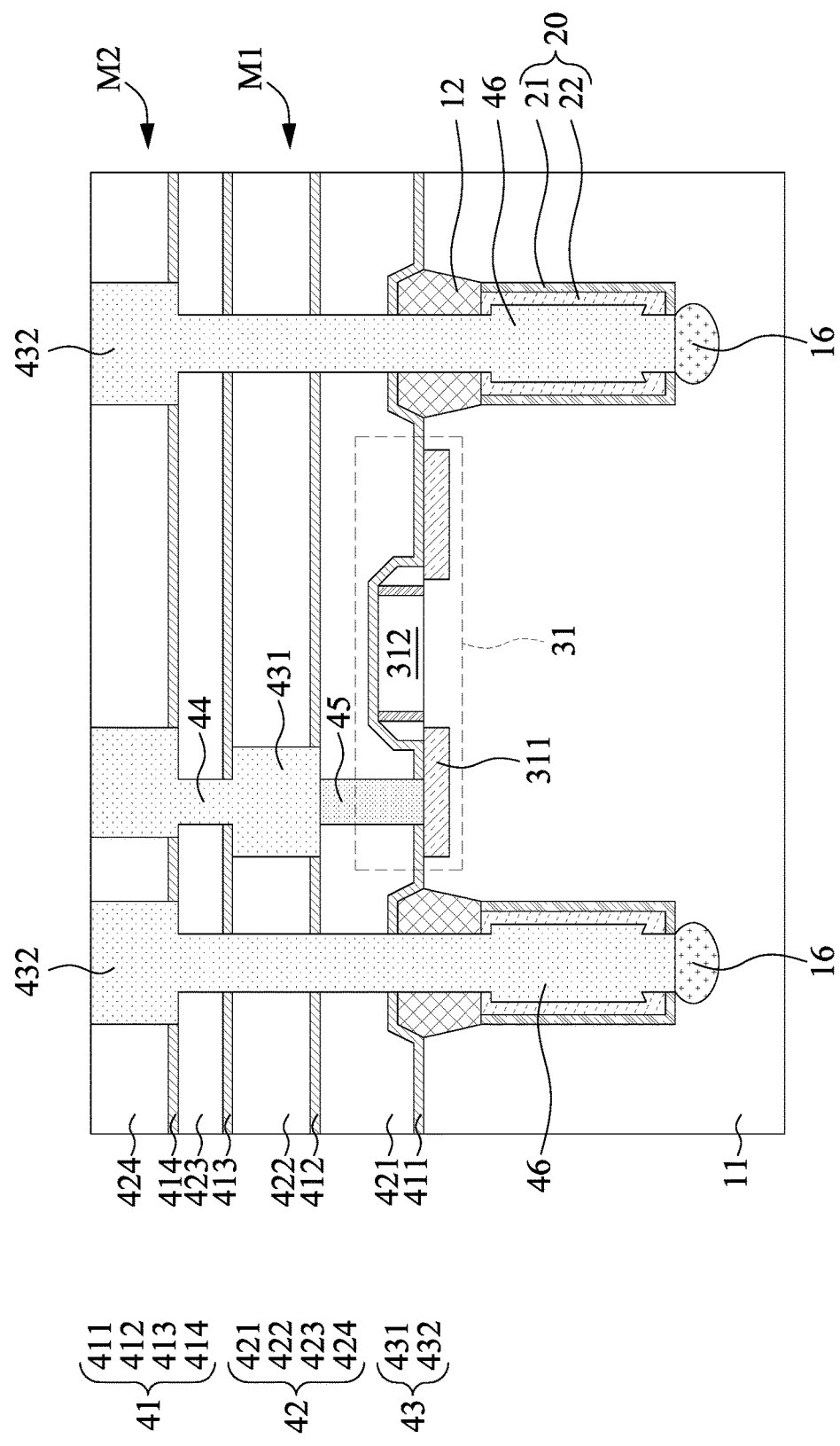
FIG. 20 is a schematic cross-sectional diagram of a semiconductor structure in accordance with some embodiments of the disclosure.

Please refer to FIG. 20, which is a schematic cross-sectional diagram at a stage of the method 600 in accordance with some embodiments of the present disclosure. In some embodiments, the conductive pillar 46 is formed after formation of one or more metal line layers. As shown in FIG. 20, the conductive pillar 46 extends from a metal line 432 in a second metal line layer M2 of the interconnect structure 40 to the bottom of the DTI 20. An etch stop layer 413, an ILD layer 423, a metal via 44, an etch stop layer 414, and an ILD layer 424 are sequentially formed over the ILD layer 422. In some embodiments, the interconnect structure 40 includes one or more metal vias 44 disposed in an ILD layer (e.g. 423) between adjacent metal line layers (e.g. M1 and M2). In some embodiments, the metal via 44 electrically connects metal lines (e.g. 431 and 432) in adjacent metal line layers (e.g. M1 and M2). The operations depicted in FIGS. 16 to 19 are performed on the ILD layer 423 to form the conductive pillar 46 and the metal lines 432 as shown in FIG. 20.

FIGS. 21 to 24 illustrate an alternative embodiment, in which the formation of the conductive pillar 46 is performed concurrently with the formation of the contact via 45.

Figure 16:
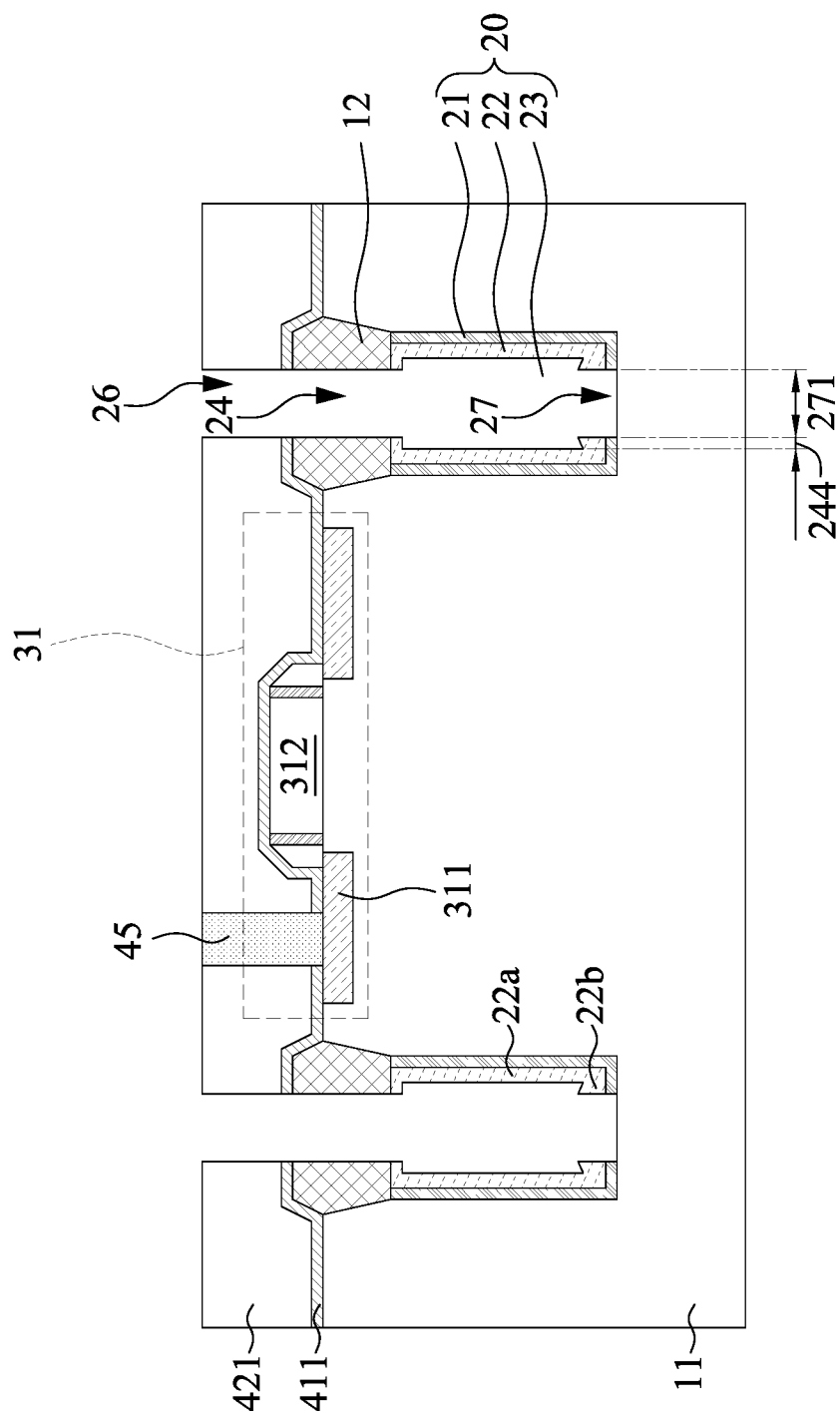
FIGS. 16 to 19 are schematic cross-sectional diagrams of a semiconductor structure at different stages of a manufacturing method in accordance with some embodiments of the disclosure.
Figure 21:
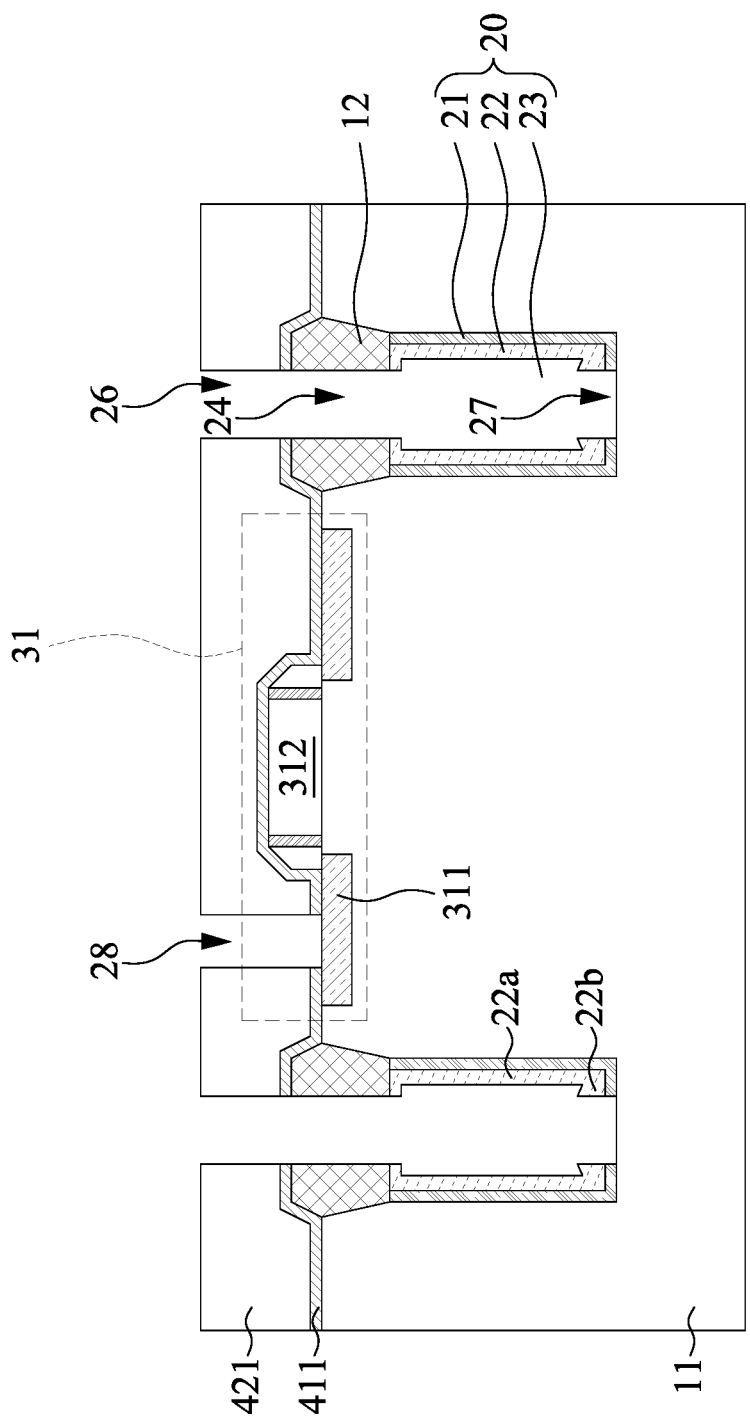
FIGS. 21 to 23 are schematic cross-sectional diagrams of a semiconductor structure at different stages of a manufacturing method in accordance with some embodiments of the disclosure.

Please refer to FIG. 21, which is a schematic cross-sectional diagram at a stage of the method 600 in accordance with some embodiments of the present disclosure. The operations depicted in FIG. 16 are performed on the intermediate structure as shown in FIG. 13. One or more etching operations may be performed. In some embodiments, an etching operation having a low selectivity to the material of the substrate 11 is performed to from openings 26, 27 and 28 concurrently. In some embodiments, an etching operation is performed to form the opening 26 and 28, and another etching operation is performed to expose the gap 23 and/or to form the opening 27. In some embodiments, the opening 28 is covered by, for example, a hard layer or a photoresist layer (not shown), prior to the exposing of the gap 23.

Figure 22:
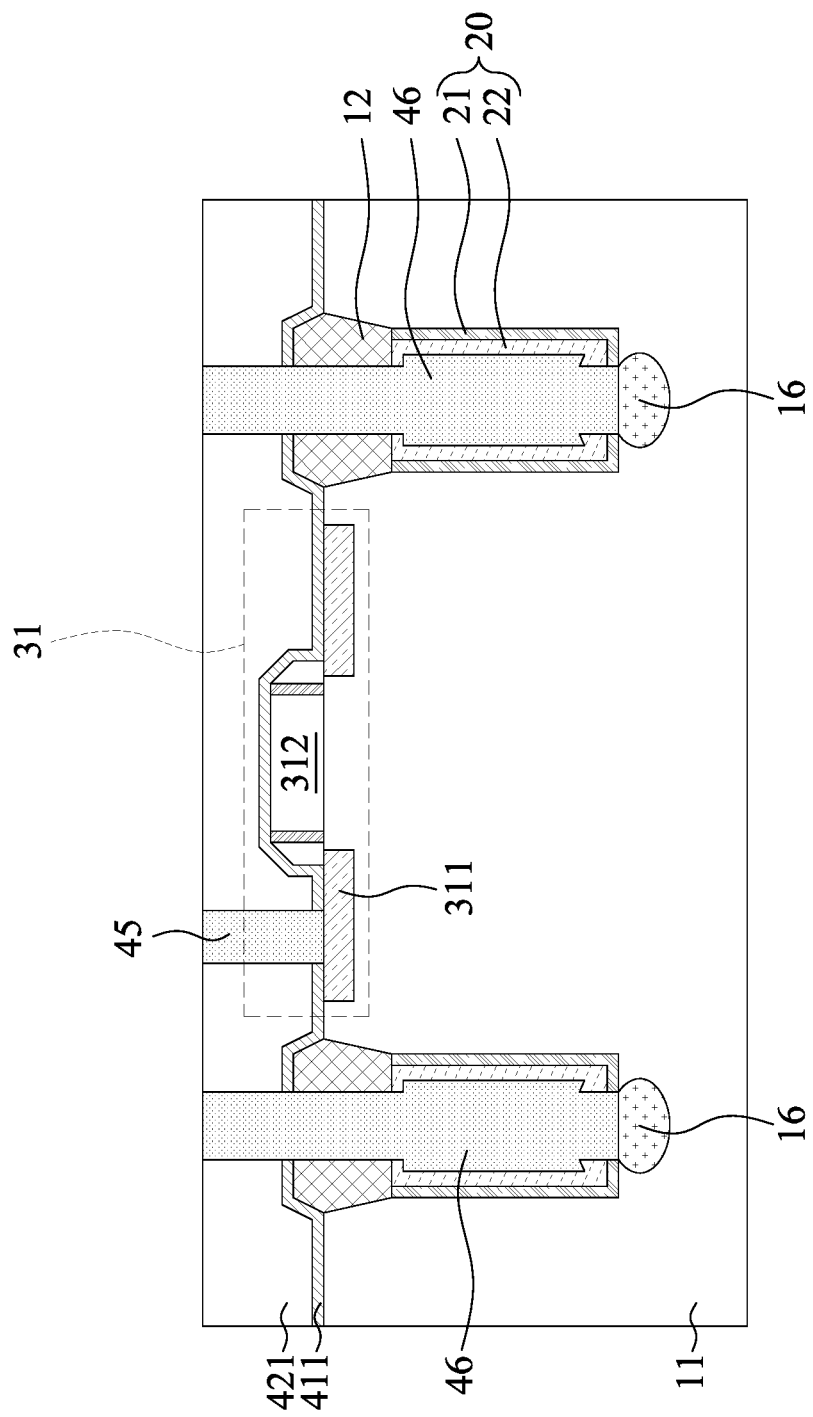

Please refer to FIG. 22, which is a schematic cross-sectional diagram at a stage of the method 600 in accordance with some embodiments of the present disclosure. The operations depicted in FIG. 17 are performed on the intermediate structure shown in FIG. 21 to form a doping region 16 at the bottom of the DTI 20. In some embodiments, the hard layer or the photoresist layer remains in the opening 28 during the formation of the doping region 16. In some embodiments, the hard layer or the photoresist layer is removed after the formation of the doping region 16. The operations depicted in FIG. 17 are then performed after the formation of the doping region 16 to form a contact via 45 and a conductive pillar 46. In some embodiments, the contact via 45 and the conductive pillar 46 are formed concurrently by a deposition. In some embodiments, the conductive pillar 46 includes a material same as a material of the contact via 45.

Figure 23:
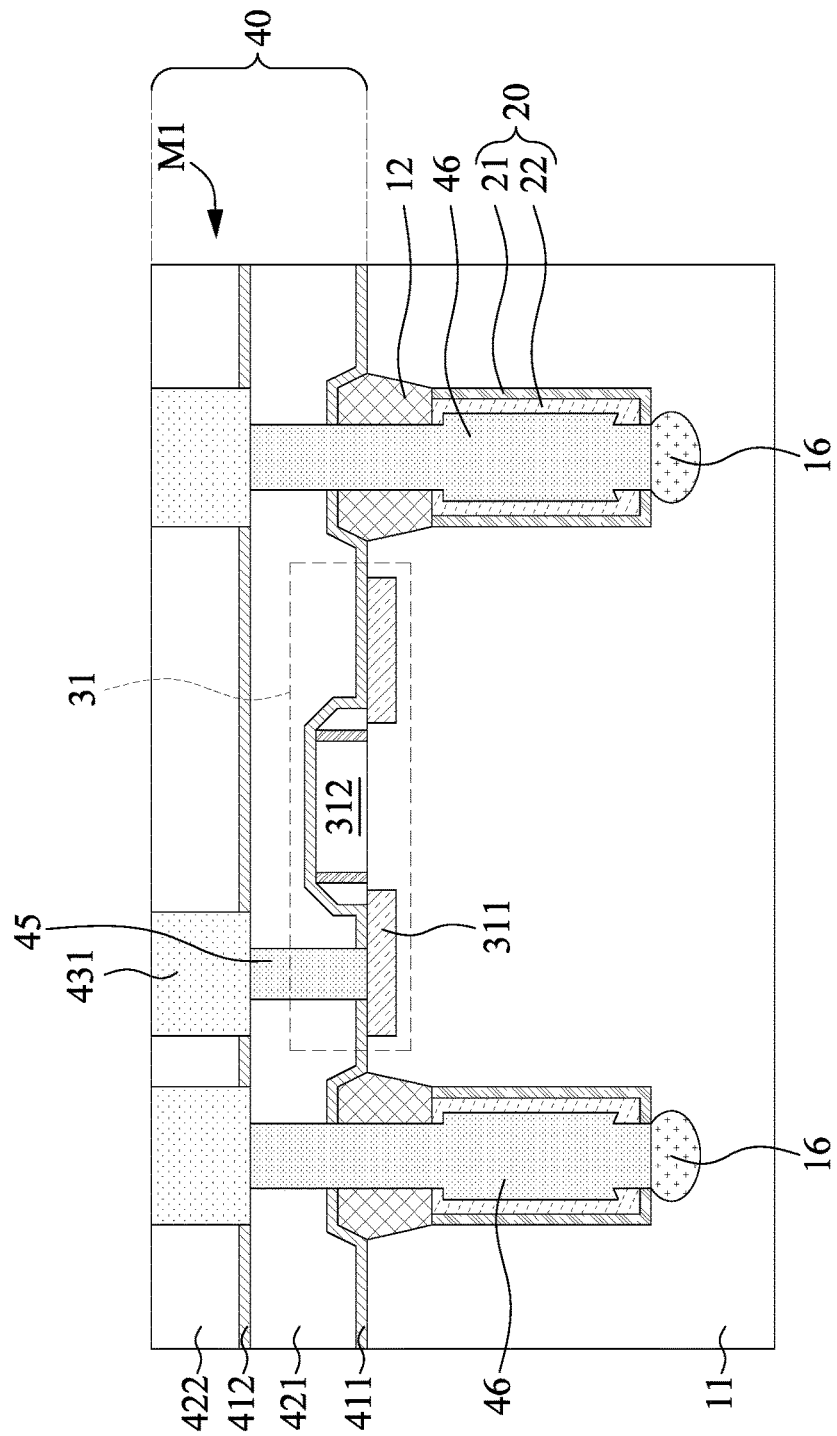

Please refer to FIG. 23, which is a schematic cross-sectional diagram at a stage of the method 600 in accordance with some embodiments of the present disclosure. The operations depicted in FIG. 19 are performed on the intermediate structure shown in FIG. 22, and a semiconductor structure 700 is thereby formed. The semiconductor structure 700 may be similar to the semiconductor structure 400, and repeated description is omitted herein.

A conventional deep trench isolation is filled by polysilicon, and a mechanical stress between the polysilicon in the deep trench isolation and a substrate results in an issue of wafer warpage. A processing temperature of a front end of line (FEOL) of a semiconductor is about or above 800 degrees Celsius, which is a relatively high temperature compared to processing temperatures of a back end of line (BEOL) of a semiconductor. The issue of wafer warpage becomes worse as the mechanical stress between the polysilicon in the conventional deep trench isolation and the substrate is induced and increased by a high thermal budget of FEOL. As technology improves and scales are reduced, misalignment of lithography processes presents a manufacturing bottleneck due to the issue of wafer warpage.

To address the above issues, the present disclosure provides a semiconductor structure and a method for forming the same. The semiconductor structure includes a deep trench isolation having a gap sealed by a dielectric layer. The presence of the gap can release the mechanical stress induced by the high thermal budget of the FEOL, and thus the issues of wafer warpage and misalignment of the lithography process can be prevented. The semiconductor structure of the present disclosure may further include a conductive pillar filling the gap. The conductive pillar can function as a buffer of the mechanical stress due to its physical property (better ductility and malleability than that of the polysilicon used in the conventional deep trench isolation). In addition, the conductive pillar is formed in BEOL, and a processing temperature of BEOL of a semiconductor is lower than that of FEOL. The mechanical stress induced by the thermal budget of BEOL is much less than that induced by the thermal budget of FEOL. The issue of wafer warpage can be thereby prevented or reduced. Besides the above benefits of stress reduction, the conductive pillar can further provide a function of controlling a substrate voltage.

In accordance with some embodiments of the disclosure, a semiconductor structure is provided. The semiconductor structure includes a substrate, a deep trench isolation (DTI), an interconnect structure, and a conductive pillar. The DTI is disposed in the substrate and the interconnect structure is disposed over the substrate. The conductive pillar extends from the interconnect structure toward the substrate and penetrates the DTI.

In accordance with some embodiments of the disclosure, a semiconductor structure is provided. The semiconductor structure includes a transistor disposed over a substrate, a shallow trench isolation (STI) disposed in a substrate around the transistor, and a deep trench isolation (DTI) disposed below the STI. The DTI includes a dielectric layer lining the substrate, and a gap sealed by the dielectric layer.

In accordance with some embodiments of the disclosure, a method for manufacturing a semiconductor structure is provided. The method may include several operations. A shallow trench isolation (STI) is formed in a substrate. A through hole is formed in the STI, and a trench is formed under the STI and connecting to the through hole. A dielectric layer is formed in the trench and the through hole. An inter-layer dielectric (ILD) layer covering the STI is formed. The trench is exposed, and a conductive pillar is formed in the trench.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   forming a shallow trench isolation (STI) in a substrate;
   forming a through hole in the STI;
   removing a portion of the substrate through the through hole to form a trench in the substrate, wherein the trench is connected to the through hole;
   forming a dielectric layer in the trench and the through hole, wherein the forming of the dielectric layer comprises:
      performing an oxidation to form a first sub-layer lining the trench; and
      performing a deposition to form a second sub-layer lining the first sub-layer and the through hole, wherein a portion of the second sub-layer seals the through hole and a gap is defined in the trench by the second sub-layer;
   forming an inter-layer dielectric (ILD) layer covering the STI;
   exposing the trench; and
   forming a conductive pillar in the trench.

2. The method of claim 1, further comprising:
   forming a hard mask over the STI and the substrate.

3. The method of claim 1, wherein the forming of the through hole and the trench comprises:
   performing a first etching operation to remove a portion of the STI; and
   performing a second etching operation to remove the portion of the substrate below the STI.

4. The method of claim 3, wherein the first etching operation has a high selectivity to a dielectric material of the STI.

5. The method of claim 3, wherein the second etching operation has a high selectivity to a material of the substrate and a low selectivity to a dielectric material of the STI.

6. A method of manufacturing a semiconductor structure, comprising:
   receiving a substrate comprising a STI formed therein;
   forming a through hole in the STI;
   removing a portion of the substrate through the through hole to form a trench in the substrate, wherein the trench is connected to the through hole, and a width of the trench is different from a width of the through hole;
   forming a dielectric layer in the trench and the through hole; and
   forming an ILD layer covering the substrate.

7. The method of claim 6, wherein a gap is sealed in the trench by the dielectric layer.

8. The method of claim 6, further comprising:
   removing a portion of the ILD layer and a portion of the dielectric layer to expose the trench; and
   forming a conductive pillar in the trench.

9. The method of claim 6, further comprising forming a transistor prior to the forming of the ILD layer.

10. The method of claim 9, further comprising forming a contact via in the ILD layer, wherein the contact via is coupled to the transistor.

11. A method of manufacturing a semiconductor structure, comprising:
    receiving a substrate comprising a STI formed therein;
    forming a through hole in the STI;
    removing a portion of the substrate through the through hole to form a trench in the substrate, wherein the trench is connected to the through hole;
    forming a dielectric layer in the trench and the through hole;
    forming an ILD layer over the substrate;
    removing a portion of the ILD layer and a portion of the dielectric layer to form a first opening coupling to the trench, wherein a portion of the substrate is exposed through a bottom of the trench; and
    forming a conductive pillar in the trench and the first opening;
    forming a transistor prior to the forming of the ILD layer; and
    forming a contact via in the ILD layer, wherein the contact via is coupled to the transistor.

12. The method of claim 11, wherein the forming of dielectric layer further comprises:
    forming a first layer covering sidewalls and the bottom of the trench; and
    forming a second layer over the first layer to seal the trench.

13. The method of claim 12, wherein the first layer is formed by a thermal oxidation.

14. The method of claim 12, wherein the second layer is formed by a deposition.

15. The method of claim 11, wherein the forming of the first opening is performed after the forming of the contact via.

16. The method of claim 11, wherein the forming of the contact via further comprising:
    removing a portion of the ILD layer to form a second opening; and
    forming the contact via in the second opening.

17. The method of claim 16, wherein the first opening and the second opening are concurrently formed.

18. The method of claim 11, further comprising forming a doped region in the portion of the substrate exposed through the bottom of the trench.

19. The method of claim 11, wherein a width of the trench is different from a width of the through hole.

20. The method of claim 19, wherein the width of the trench is greater than the width of the through hole.

* * * * *